(12) United States Patent
Hayami et al.

(10) Patent No.: US 6,853,320 B2
(45) Date of Patent: Feb. 8, 2005

(54) MODULATION SYSTEM

(75) Inventors: Atsushi Hayami, Yokohama (JP); Takayuki Sugahara, Yokosuka (JP)

(73) Assignee: Victor Company of Japan, Ltd., Yokohama (JP)

( * ) Notice: Subject to any disclaimer, the term of this patent is extended or adjusted under 35 U.S.C. 154(b) by 605 days.

(21) Appl. No.: 10/005,247

(22) Filed: Dec. 7, 2001

(65) Prior Publication Data

US 2002/0093750 A1 Jul. 18, 2002

(30) Foreign Application Priority Data

Jan. 16, 2001 (JP) .......................... 2001-007389
Jan. 22, 2001 (JP) .......................... 2001-013312

(51) Int. Cl.$^7$ ................................ H03M 3/00
(52) U.S. Cl. ................. 341/143; 341/50; 341/68; 341/69; 341/61
(58) Field of Search .............. 341/143, 61, 68, 341/69, 59, 58, 106

(56) References Cited

U.S. PATENT DOCUMENTS

| | | | | |
|---|---|---|---|---|
| 5,508,701 | A | * 4/1996 | Nose et al. | 341/58 |
| 5,627,694 | A | * 5/1997 | Ido et al. | 360/51 |
| 5,633,632 | A | * 5/1997 | Ido et al. | 341/58 |
| 5,790,056 | A | * 8/1998 | Schouhamer Immink | 341/58 |
| 6,445,313 | B2 | * 9/2002 | Ahn | 341/59 |
| 6,492,920 | B2 | * 12/2002 | Oki et al. | 341/106 |
| 6,573,848 | B2 | * 6/2003 | Hayami | 341/68 |
| 6,690,308 | B2 | * 2/2004 | Hayami | 341/68 |
| 6,778,104 | B2 | * 8/2004 | Chen et al. | 341/59 |

FOREIGN PATENT DOCUMENTS

| | | |
|---|---|---|
| EP | 0548415 | 6/1993 |
| EP | 0991195 | 4/2000 |
| JP | 6-195887 | 7/1994 |
| JP | 10-269289 | 10/1998 |
| JP | 10-283268 | 10/1998 |
| JP | 10-340543 | 12/1998 |
| JP | 11-120633 | 4/1999 |
| JP | 2000-105981 | 4/2000 |
| JP | 2000-332613 | 11/2000 |
| WO | WO 0057416 | 9/2000 |

OTHER PUBLICATIONS

Hayami (U.S. Appl. No. 09/989,395) "A Modulation System" filed Nov. 21, 2004.*
Hayami (U.S. Appl. No. 10/060,337) "A Modulation System" filed Feb. 1, 2002.*
Hayami (U.S. Appl. No. 10/355,115) "A method and apparatus for modulating and demodulating digital data", filed Jan. 31, 2003.*
D.J. Lynch, "The Suitability of Various Line Coding Techniques for the Simultaneous Transmission of Data with Voice over Copper Telephone lines", Dec. 1997, pp. 12–59, xp2213739.

* cited by examiner

Primary Examiner—Jean Bruner Jeanglaude
(74) Attorney, Agent, or Firm—Louis Woo

(57) ABSTRACT

A 6-bit output code word is generated in response to every 4-bit input code word by referring to a set of encoding tables. The encoding tables contain output code words assigned to input code words, and contain encoding-table designation information accompanying each output code word. The encoding-table designation information designates an encoding table among the encoding tables which is used next to generate an output code word immediately following the output code word accompanied with the encoding-table designation information. The generated output code words are sequentially connected into a sequence which follows run length limiting rules. The run length limiting rules are changed between RLL(1, 7) and RLL(1, 8) in response to auxiliary information to superimpose the auxiliary information on the sequence of the generated output code words.

44 Claims, 21 Drawing Sheets

FIG. 1

| DECIMAL | BINARY |
|---|---|
| 0 | 000000 |
| 1 | 000001 |
| 2 | 000010 |
| 4 | 000100 |
| 5 | 000101 |
| 8 | 001000 |
| 9 | 001001 |
| 10 | 001010 |
| 16 | 010000 |
| 17 | 010001 |
| 18 | 010010 |
| 20 | 010100 |
| 21 | 010101 |
| 32 | 100000 |
| 33 | 100001 |
| 34 | 100010 |
| 36 | 100100 |
| 37 | 100101 |
| 40 | 101000 |
| 41 | 101001 |
| 42 | 101010 |

FIG. 2

| ID NUMBER | 0 | | | 1 | | | 2 | | | 3 | | |
|---|---|---|---|---|---|---|---|---|---|---|---|---|
| D(k) | | C(k) | S(k+1) | | C(k) | S(k+1) | | C(k) | S(k+1) | | C(k) | S(k+1) |
| 0 | 1 | 000001 | 0 | 9 | 001001 | 0 | 33 | 100001 | 0 | 41 | 101001 | 0 |
| 1 | 1 | 000001 | 1 | 9 | 001001 | 1 | 33 | 100001 | 1 | 41 | 101001 | 1 |
| 2 | 17 | 010001 | 0 | 5 | 000101 | 0 | 17 | 010001 | 0 | 37 | 100101 | 0 |
| 3 | 17 | 010001 | 1 | 5 | 000101 | 1 | 17 | 010001 | 1 | 37 | 100101 | 1 |
| 4 | 18 | 010010 | 1 | 2 | 000010 | 1 | 18 | 010010 | 1 | 34 | 100010 | 1 |
| 5 | 18 | 010010 | 2 | 2 | 000010 | 2 | 18 | 010010 | 2 | 34 | 100010 | 2 |
| 6 | 18 | 010010 | 3 | 2 | 000010 | 3 | 18 | 010010 | 3 | 34 | 100010 | 3 |
| 7 | 21 | 010101 | 0 | 4 | 000100 | 1 | 36 | 100100 | 1 | 21 | 010101 | 0 |
| 8 | 21 | 010101 | 1 | 4 | 000100 | 2 | 36 | 100100 | 2 | 21 | 010101 | 1 |
| 9 | 20 | 010100 | 1 | 4 | 000100 | 3 | 36 | 100100 | 3 | 20 | 010100 | 1 |
| 10 | 20 | 010100 | 2 | 10 | 001010 | 1 | 42 | 101010 | 1 | 20 | 010100 | 2 |
| 11 | 20 | 010100 | 3 | 10 | 001010 | 2 | 42 | 101010 | 2 | 20 | 010100 | 3 |
| 12 | 0 | 000000 | 2 | 10 | 001010 | 3 | 42 | 101010 | 3 | 32 | 100000 | 2 |
| 13 | 0 | 000000 | 3 | 8 | 001000 | 1 | 40 | 101000 | 1 | 32 | 100000 | 3 |
| 14 | 16 | 010000 | 2 | 8 | 001000 | 2 | 40 | 101000 | 2 | 16 | 010000 | 2 |
| 15 | 16 | 010000 | 3 | 8 | 001000 | 3 | 40 | 101000 | 3 | 16 | 010000 | 3 |

FIG. 3

| ID D(k) | 0 | | | 1 | | | 2 | | | 3 | | |
|---|---|---|---|---|---|---|---|---|---|---|---|---|
| | | C(k) | S(k+1) | | C(k) | S(k+1) | | C(k) | S(k+1) | | C(k) | S(k+1) |
| 0 | 1 | 000001 | 0 | 9 | 001001 | 0 | 33 | 100001 | 0 | 41 | 101001 | 0 |
| 1 | 17 | 010001 | 1 | 5 | 000101 | 1 | 17 | 010001 | 1 | 37 | 100101 | 1 |
| 2 | 18 | 010010 | 2 | 2 | 000010 | 2 | 18 | 010010 | 2 | 34 | 100010 | 2 |
| 3 | 17 | 010001 | 0 | 5 | 000101 | 0 | 17 | 010001 | 0 | 37 | 100101 | 0 |
| 4 | 18 | 010010 | 1 | 2 | 000010 | 1 | 18 | 010010 | 1 | 34 | 100010 | 1 |
| 5 | 1 | 000001 | 1 | 9 | 001001 | 1 | 33 | 100001 | 1 | 41 | 101001 | 1 |
| 6 | 18 | 010010 | 3 | 2 | 000010 | 3 | 18 | 010010 | 3 | 34 | 100010 | 3 |
| 7 | 20 | 010100 | 1 | 4 | 000100 | 1 | 36 | 100100 | 1 | 20 | 010100 | 1 |
| 8 | 21 | 010101 | 0 | 4 | 000100 | 2 | 36 | 100100 | 2 | 21 | 010101 | 2 |
| 9 | 20 | 010100 | 2 | 4 | 000100 | 3 | 36 | 100100 | 3 | 20 | 010100 | 3 |
| 10 | 21 | 010101 | 1 | 10 | 001010 | 1 | 42 | 101010 | 1 | 21 | 010101 | 1 |
| 11 | 20 | 010100 | 3 | 8 | 001000 | 3 | 40 | 101000 | 3 | 20 | 010100 | 3 |
| 12 | 16 | 010000 | 2 | 8 | 001000 | 2 | 40 | 101000 | 2 | 16 | 010000 | 2 |
| 13 | 0 | 000000 | 3 | 10 | 001010 | 3 | 42 | 101010 | 3 | 32 | 100000 | 3 |
| 14 | 16 | 010000 | 3 | 8 | 001000 | 3 | 40 | 101000 | 3 | 16 | 010000 | 3 |
| 15 | 0 | 000000 | 2 | 10 | 001010 | 2 | 42 | 101010 | 2 | 32 | 100000 | 2 |

F I G. 5

| RECORDING SECTOR | 0 | 1 | 2 | 3 | 4 | ... |
|---|---|---|---|---|---|---|
| MAX RUN SETTING SIGNAL | 1 | 0 | 0 | 1 | 1 | ... |
| Tmax | 9 | 8 | 8 | 9 | 9 | |

FIG. 7
| INPUT CODE WORD D(k) | CURRENT-TABLE SELECTION NUMBER S(k) | OUTPUT CODE WORD C(k) | NEXT-TABLE SELECTION NUMBER S(k+1) |
|---|---|---|---|
| 4 | 0 | 18 | 1 |
| 5 | 1 | 2 | 2 |
| 6 | 2 | 18 | 3 |
| 7 | 3 | 21 | 0 |
| 8 | 0 | 21 | 1 |
FIG. 9
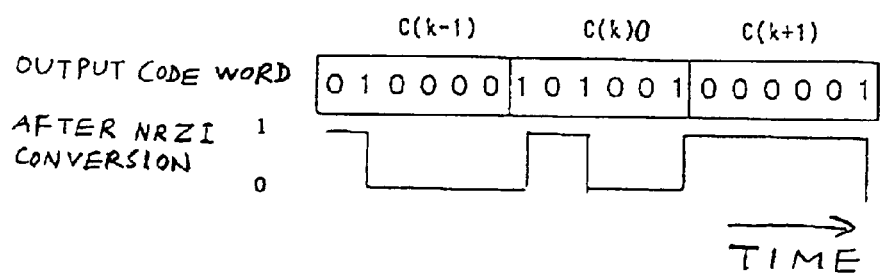
FIG. 10
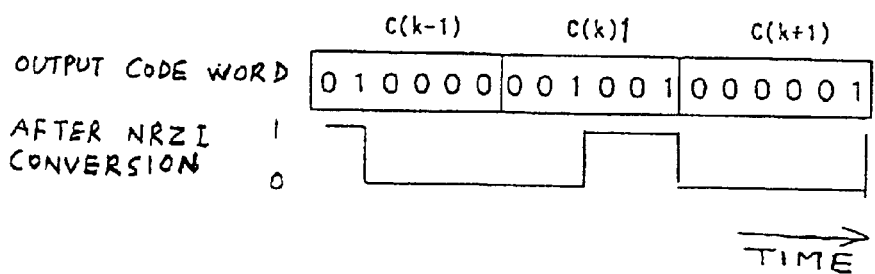

FIG. 15

| C(k-1) | | DECISION INFORMATION | D(k-1) | | | |
|---|---|---|---|---|---|---|
| DECIMAL | BINARY | | S(k)=0 | S(k)=1 | S(k)=2 | S(k)=3 |
| 0 | 000000 | 2 | 7 | – | 12 | 13 |
| 1 | 000001 | 0 | 0 | 1 | – | – |
| 2 | 000010 | 1 | – | 4 | 5 | 6 |
| 4 | 000100 | 1 | – | 7 | 8 | 9 |
| 5 | 000101 | 0 | 2 | 3 | – | – |
| 8 | 001000 | 1 | – | 13 | 14 | 15 |
| 9 | 001001 | 0 | 0 | 1 | – | – |
| 10 | 001010 | 1 | – | 10 | 11 | 12 |
| 16 | 010000 | 2 | – | – | 14 | 15 |
| 17 | 010001 | 0 | 2 | 3 | – | – |
| 18 | 010010 | 1 | – | 4 | 5 | 6 |
| 20 | 010100 | 1 | – | 9 | 10 | 11 |
| 21 | 010101 | 0 | 7 | 8 | – | – |
| 32 | 100000 | 2 | – | – | 12 | 13 |
| 33 | 100001 | 0 | 0 | 1 | – | – |
| 34 | 100010 | 1 | – | 4 | 5 | 6 |
| 37 | 100101 | 0 | 2 | 3 | – | – |
| 40 | 101000 | 1 | – | 13 | 14 | 15 |
| 41 | 101001 | 0 | 7 | 8 | – | – |
| 42 | 101010 | 1 | – | 10 | 12 | 11 |

| D(k) | C(k) | DECISION INFORMATION | S(k) |
|------|--------|---|---|
| 15   | 010000 | 2 | 3 |
| 0    | 001001 | 0 | 0 |
| 1    | 000001 | 0 | 1 |
| 2    | 000101 | 0 | 0 |
| 3    | 010001 | 0 | — |

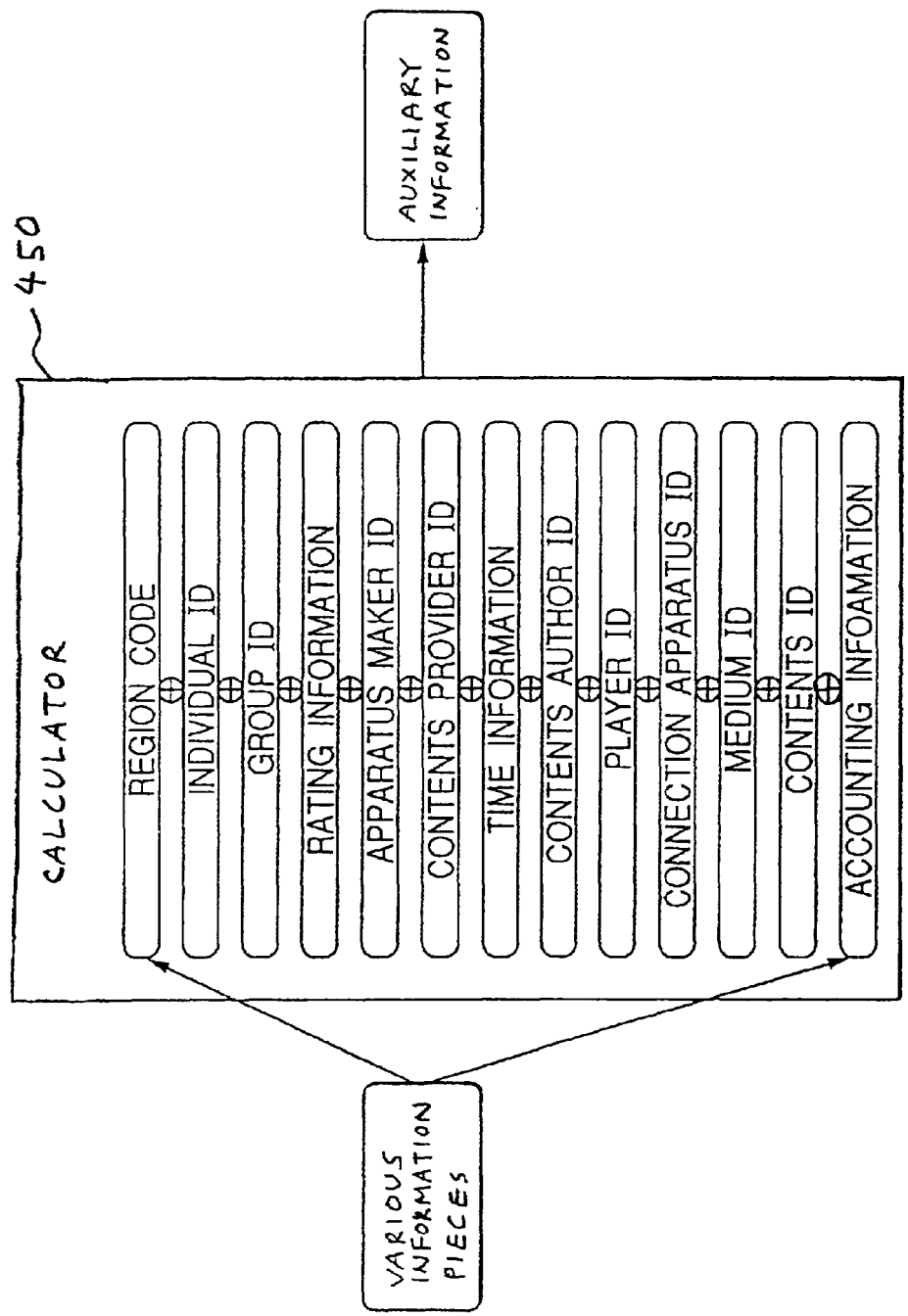

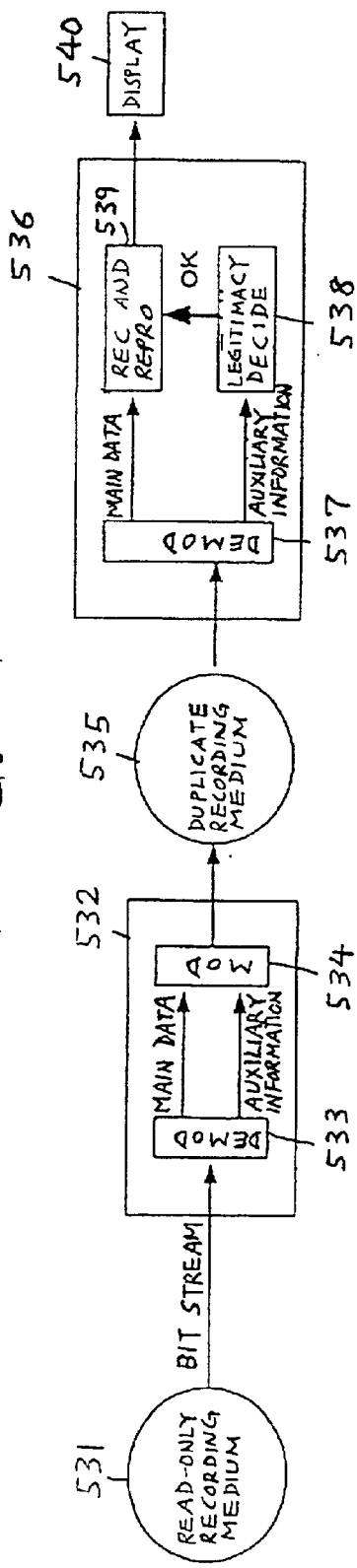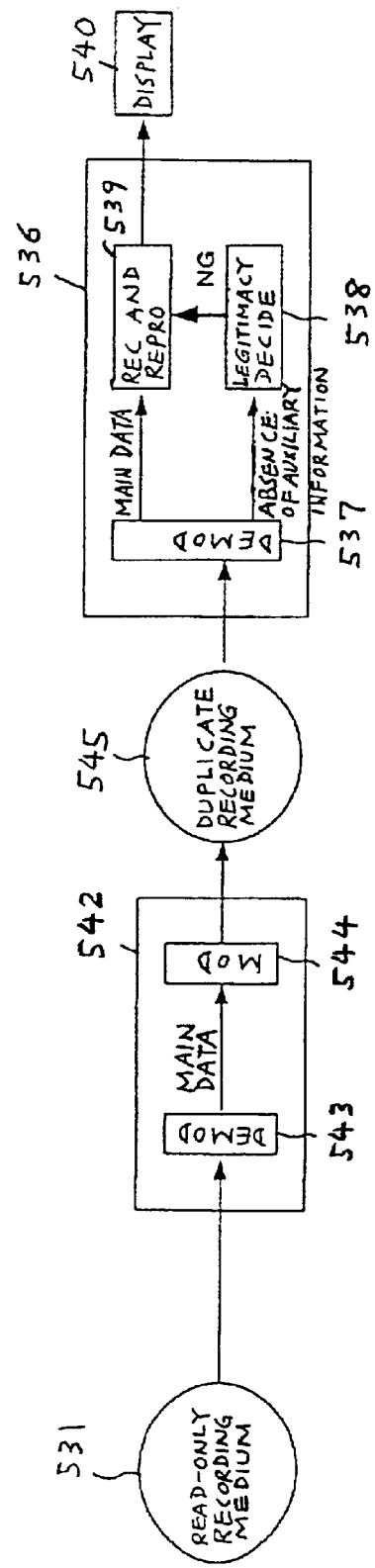

MODULATION SYSTEM

BACKGROUND OF THE INVENTION

1. Field of the Invention

This invention relates to a modulation method, a modulation apparatus, a demodulation method, a demodulation apparatus, an information recording medium, an information transmission method, and an information transmission apparatus. In addition, this invention relates to a method of recording auxiliary information, an apparatus for recording auxiliary information, a method of reproducing auxiliary information, an apparatus for reproducing auxiliary information, a method of reproducing data, and an apparatus for reproducing data.

2. Description of the Related Art

Some modulation (encoding) procedures used for digital signals recorded on recording mediums are of a (1, 7)RLL type, where "(1, 7)RLL" means run length limiting rules such that 1 to 7 successive bits of "0" should be between bits of "1" in a modulation-resultant bit stream. The (1, 7)RLL modulation tends to insufficiently suppress DC and near-DC components of a modulation-resultant bit stream. Therefore, in specified conditions, the spectrum of an information signal enters a frequency band assigned to a servo signal. In this case, the information signal interferes with servo control.

Japanese patent application publication number 6-195887/1994 discloses first and second modulation apparatuses. The first modulation apparatus in Japanese application 6-195887 processes an input signal which has a sequence of symbols each having one byte. The first modulation apparatus includes an inverting circuit, a parallel-to-serial converting circuit, and a (1, 7)RLL modulation circuit. The inverting circuit receives the input signal, and inverts all bits in every odd-numbered symbol. The inverting circuit keeps every even-numbered symbol unchanged. The output signal from the inverting circuit is converted into a first bit stream by the parallel-to-serial converting circuit. The (1, 7)RLL modulation circuit subjects the first bit stream to (1, 7)RLL modulation, thereby generating a modulation-resultant bit stream (a second bit stream). The inversion of every odd-numbered symbol by the inverting circuit causes the suppression of a DC component of the modulation-resultant bit stream.

The second modulation apparatus in Japanese application 6-195887 includes a randomizing circuit and a (1, 7)RLL modulation circuit. The randomizing circuit receives an input signal, and randomizes the input signal. The randomizing circuit outputs the randomizing-resultant signal to the (1, 7)RLL modulation circuit. The (1, 7)RLL modulation circuit subjects the randomizing-resultant signal to (1, 7)RLL modulation, thereby generating a modulation-resultant bit stream. The signal processing by the randomizing circuit causes the suppression of a DC component of the modulation-resultant bit stream.

Japanese patent application publication number 10-340543/1998 discloses (1, 7)RLL modulation provided with DSV (digital sum variation) control for suppressing DC and low-frequency components of a modulation-resultant bit stream. According to the (1, 7)RLL modulation in Japanese application 10-340543, three successive bits in every prescribed position in a (1, 7)RLL code string is replaced by six successive DSV control bits of a pattern chosen so that the rules "(1, 7)RLL" will be observed.

Japanese patent application publication number 2000-105981 discloses (1, 8)RLL modulation provided with DSV control for suppressing DC and low-frequency components of a modulation-resultant bit stream. The (1, 8)RLL modulation in Japanese application 2000-105981 includes 8–12 modulation. The 8–12 modulation refers to a table containing 12-bit output code words assigned to 8-bit input code words respectively. Input data are divided into 8-bit segments each handled as an input code word. Every input code word is converted into an output code word by referring to the table. Specifically, the output code word assigned to the input code word is read out from the table. As a result, the input data are converted into a modulation-resultant bit stream formed by a sequence of output code words read out from the table. The output code words in the table and the output code words read out therefrom to form the modulation-resultant bit stream are designed so that the modulation-resultant bit stream will follow the rules "(1, 8)RLL". Specifically, a succession of a preliminary current output code word and a next output code word is generated in response to every two successive input code words. Conditions of the connection between the preliminary current output code word and the next output code word are checked to decide whether or not the succession follows the rules "(1, 8)RLL". When it is decided that the succession does not follow the rules "(1, 8)RLL", the preliminary current output code word is replaced by another current output code word.

Japanese patent application publication number 2000-286709 discloses a modulation system which includes a formatter, an 8–15 modulator, and an NRZI converter. The formatter converts an input digital signal into a second digital signal of a predetermined format. The formatter outputs the second digital signal to the 8–15 modulator. The 8–15 modulator contains a set of seven different encoding tables. The 8–15 modulator converts or encodes every 8-bit block of the output digital signal from the formatter into a 15-bit code word by referring to the set of the encoding tables. The 15-bit code word forms a 15-bit block of a modulation-resultant bit stream (a modulation-resultant digital signal). The 15-bit code word is chosen to enable its NRZI conversion result to follow run length limiting rules such that a minimum run length is 3T and a maximum run length is 11T where T denotes the length or period of one bit (one channel bit). The 8–15 modulator outputs the modulation-resultant bit stream (the modulation-resultant digital signal) to the NRZI converter. The NRZI converter subjects the output digital signal of the 8–15 modulator to NRZI modulation, thereby generating a digital signal of an NRZI code.

In the modulation system of Japanese application 2000-286709, each of the encoding tables stores 15-bit code words assigned to different states of an 8-bit input block respectively. In addition, each of the encoding tables contains state information for selecting one from the encoding tables which will be used to convert a next 8-bit input block. This design is to enable the NRZI conversion result of a succession of two selected 15-bit code words to follow the run length limiting rules. The contents of the encoding tables are optimized in view of information about the frequencies of occurrence of different states of an 8-bit input block. Furthermore, first and second specified ones of the encoding tables are designed so that the NRZI modulation results of 15-bit code words in the first specified encoding table which correspond to prescribed 8-bit input blocks will be opposite in polarity ("odd-even" in the number of "1") to those of 15-bit code words in the second specified encoding table.

In the modulation system of Japanese application 2000-286709, two candidate 15-bit code words may be selected from the first and second specified encoding tables in response to a given 8-bit input block. DSVs (digital sum variations) are calculated for the candidate 15-bit code words, respectively. The absolute values of the DSVs are compared. One of the candidate 15-bit code words which corresponds to the smaller of the absolute values of the DSVs is finally selected as a 15-bit output code word. In this way, DSV control is implemented.

Japanese patent application publication number 2000-332613 discloses a 4–6 modulator. The 4–6 modulator contains a set of four different encoding tables. The 4–6 modulator converts or encodes every 4-bit input code word into a 6-bit output code word by referring to the set of the encoding tables. The 6-bit output code word forms a 6-bit block of a modulation-resultant bit stream. Each of the encoding tables stores 6-bit output code words assigned to 4-bit input code words respectively. In addition, the encoding tables contain next-table selection numbers accompanying the respective 6-bit output code words therein. Each of the next-table selection numbers designates one among the encoding tables which will be used to convert a next 4-bit input code word. The output code words and the next-table selection numbers in the encoding tables are designed so that the modulation-resultant bit stream formed by a succession of selected output code words will follow (1, 7)RLL. First and second specified ones of the encoding tables are designed so that 6-bit output code words in the first specified encoding table which correspond to prescribed 4-bit input code words will be opposite in polarity ("odd-even" in the number of "1") to those of 6-bit output code words in the second specified encoding table.

In the 4–6 modulator of Japanese application 2000-332613, two candidate 6-bit output code words may be selected from the first and second specified encoding tables in response to a given 4-bit input code word. DSVs (digital sum variations) are calculated for the candidate 6-bit output code words, respectively. The absolute values of the DSVs are compared. One of the candidate 6-bit output code words which corresponds to the smaller of the absolute values of the DSVs is selected as a final 6-bit output code word. In this way, DSV control is implemented.

Japanese application 2000-332613 further discloses a demodulation apparatus including a 6–4 demodulator. In Japanese application 2000-332613, the 6–4 demodulator recovers encoding-table designation information from a sequence of 6-bit code words. The encoding-table designation information represents which of encoding tables has been used in generating a code word immediately following a code word of interest. The 6–4 demodulator decodes the code word of interest into an original code word by referring to a decoding table in response to the recovered encoding-table designation information.

Japanese patent application publication number 10-269289/1998 discloses a digital contents distribution managing system in which a distributor side encrypts and compresses original digital contents information into encryption-resultant contents information. The distributor side transmits the encryption-resultant contents information, encryption-resultant key information, and encryption-resultant accounting information to a communication opposite party, that is, a user side. The distributor side receives contents-use information from the user side. The distributor side implements a process of collecting a charge for using the original contents information on the basis of the received contents-use information. The distributor side also implements a process of dividing the collected charge among the parties concerned which include the holder of the copyright of the original contents information. The user side decrypts the encryption-resultant key information to recover the original key information. The user side decrypts the encryption-resultant contents information in response to the recovered original key information, and expands the decryption-resultant contents information into the original contents information. The user side decrypts the encryption-resultant accounting information to recover the original accounting information. The user side updates the original accounting information in accordance with use of the original contents information. The user side transmits the related contents-use information to the distributor side. The user side can install the original contents information on a portable storage medium or a removable storage medium.

Japanese patent application publication number 10-283268/1998 discloses a recording medium which stores an encrypted version of main information and an encrypted version of key information. The key information can be used in decrypting the encrypted version of the main information. The encrypted version of the key information has a non-encrypted portion containing control information. The control information represents conditions for permitting the decryption of the encrypted version of the main information. The control information has machine information and region information. The control information prevents a user side from copying the encrypted version of the main information onto a hard disk or an optical disk.

In general, the inner portion of the disc member of each DVD is formed with a burst cutting area (BCA) for copy protection.

Japanese patent application publication number 11-120633/1999 discloses an optical disc having watermarks which are visible from the reproducing surface side of the disc, and which can be hardly formed on a forged disc. The optical disc includes a main transparent substrate on which a reflection layer, an adhesive layer, and a dummy transparent substrate are successively laminated. The adhesive layer is made of adhesive agent whose curing rate depends on the rate of the exposure to electromagnetic radiations. The reflection layer and the adhesive layer are located between an information-signal recording surface of the main transparent substrate and a first surface of the dummy transparent substrate. During the fabrication of the optical disc, a mask with a pattern for making the watermarks is placed above a second surface of the dummy transparent substrate which is remote from the adhesive layer. Electromagnetic radiations are applied via the mask to the adhesive layer. The curing rate of the adhesive agent spatially varies in accordance with a pattern of the mask so that a distribution of stresses which depends on the pattern of the mask occurs on the reflection layer. As a result, the reflection layer slightly deforms in accordance with the pattern of the mask. The deformation of the reflection layer forms the watermarks. Such watermarks enable legitimate discs and forged discs to be discriminated from each other.

SUMMARY OF THE INVENTION

It is a first object of this invention to provide a modulation method which is excellent in encoding rate (encoding efficiency) and copy protection.

It is a second object of this invention to provide a modulation apparatus which is excellent in encoding rate and copy protection.

It is a third object of this invention to provide a demodulation method which is excellent in encoding rate and copy protection.

It is a fourth object of this invention to provide a demodulation apparatus which is excellent in encoding rate and copy protection.

It is a fifth object of this invention to provide an information recording medium which is excellent in encoding rate and copy protection.

It is a sixth object of this invention to provide an information transmission method which is excellent in encoding rate and copy protection.

It is a seventh object of this invention to provide an information transmission apparatus which is excellent in encoding rate and copy protection.

It is an eighth object of this invention to provide a method of recording auxiliary information which is excellent in encoding rate and copy protection.

It is a ninth object of this invention to provide an apparatus for recording auxiliary information which is excellent in encoding rate and copy protection.

It is a tenth object of this invention to provide a method of reproducing auxiliary information which is excellent in encoding rate and copy protection.

It is an eleventh object of this invention to provide an apparatus for reproducing auxiliary information which is excellent in encoding rate and copy protection.

It is a twelfth object of this invention to provide a method of reproducing data which is excellent in encoding rate and copy protection.

It is a thirteenth object of this invention to provide an apparatus for reproducing data which is excellent in encoding rate and copy protection.

A first aspect of this invention provides a modulation method comprising the steps of generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; sequentially connecting the generated output code words into a sequence which follows run length limiting rules; and changing the run length limiting rules between RLL(1, 7) and RLL(1, 8) in response to auxiliary information to superimpose the auxiliary information on the sequence of the generated output code words.

A second aspect of this invention is based on the first aspect thereof, and provides a modulation method wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising the steps of generating a first candidate current output code word in response to a current input code word equal to one of the prescribed input code words by referring to the first specified one of the encoding tables, and generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

A third aspect of this invention is based on the second aspect thereof, and provides a modulation method further comprising the step of selecting one from the first and second candidate current output code words as a final current output code word.

A fourth aspect of this invention is based on the second aspect thereof, and provides a modulation method further comprising the steps of calculating a first CDS of the first candidate current output code word; updating a first DSV of the first candidate current output code word and previous final output code words in response to the first CDS; calculating a second CDS of the second candidate current output code word; updating a second DSV of the second candidate current output code word and previous final output code words in response to the second CDS; determining which of an absolute value of the first DSV and an absolute value of the second DSV is smaller; and selecting one from the first and second candidate current output code words which corresponds to the smaller DSV absolute value as a final current output code word.

A fifth aspect of this invention is based on the first aspect thereof, and provides a modulation method further comprising the steps of predicting repetition of a minimum run length at least a predetermined number of times in the sequence of the generated output code words; and when the repetition of the minimum run length is predicted, changing an output code word causing the repetition to prevent the repetition of the minimum run length from occurring in the sequence of the generated output code words.

A sixth aspect of this invention provides a modulation apparatus comprising means for generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; means for sequentially connecting the generated output code words into a sequence which follows run length limiting rules; and means for changing the run length limiting rules between RLL(1, 7) and RLL(1, 8) in response to auxiliary information to superimpose the auxiliary information on the sequence of the generated output code words.

A seventh aspect of this invention is based on the sixth aspect thereof, and provides a modulation apparatus wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising means for generating a first candidate current output code word in response to a current input code word equal to one of the prescribed input code words by referring to the first specified one of the encoding tables, and means for generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

An eighth aspect of this invention is based on the seventh aspect thereof, and provides a modulation apparatus further comprising means for selecting one from the first and second candidate current output code words as a final current output code word.

A ninth aspect of this invention is based on the seventh aspect thereof, and provides a modulation apparatus further comprising means for calculating a first CDS of the first candidate current output code word; means for updating a first DSV of the first candidate current output code word and previous final output code words in response to the first CDS; means for calculating a second CDS of the second candidate current output code word; means for updating a second DSV of the second candidate current output code word and previous final output code words in response to the second CDS; means for determining which of an absolute value of the first DSV and an absolute value of the second DSV is smaller; and means for selecting one from the first and second candidate current output code words which corresponds to the smaller DSV absolute value as a final current output code word.

A tenth aspect of this invention is based on the sixth aspect thereof, and provides a modulation apparatus further comprising means for predicting repetition of a minimum run length at least a predetermined number of times in the sequence of the generated output code words; and means for, when the repetition of the minimum run length is predicted, changing an output code word causing the repetition to prevent the repetition of the minimum run length from occurring in the sequence of the generated output code words.

An eleventh aspect of this invention provides a demodulation method of demodulating a sequence of 6-bit code words which is generated by the modulation method in the first aspect of this invention. The demodulation method comprises the steps of recovering encoding-table designation information from the code-word sequence, the encoding-table designation information representing which of encoding tables has been used in generating a code word immediately following a code word of interest; and demodulating the code word of interest into an original code word by referring to a decoding table in response to the recovered encoding-table designation information.

A twelfth aspect of this invention is based on the eleventh aspect thereof, and provides a demodulation method further comprising the steps of detecting whether the code-word sequence corresponds to (1, 7)RLL or (1, 8)RLL; and reproducing auxiliary information in response to a result of detecting whether the code-word sequence corresponds to (1, 7)RLL or (1, 8)RLL.

A thirteenth aspect of this invention provides a demodulation apparatus for demodulating a sequence of 6-bit code words which is generated by the modulation apparatus in the sixth aspect of this invention. The demodulation apparatus comprises means for recovering encoding-table designation information from the code-word sequence, the encoding-table designation information representing which of encoding tables has been used in generating a code word immediately following a code word of interest; and means for demodulating the code word of interest into an original code word by referring to a decoding table in response to the recovered encoding-table designation information.

A fourteenth aspect of this invention is based on the thirteenth aspect thereof, and provides a demodulation apparatus further comprising means for detecting whether the code-word sequence corresponds to (1, 7)RLL or (1, 8)RLL; and means for reproducing auxiliary information in response to a result of detecting whether the code-word sequence corresponds to (1, 7)RLL or (1, 8)RLL.

A fifteenth aspect of this invention provides an information recording medium storing a sequence of code words which is generated by the modulation apparatus in the sixth aspect of this invention.

A sixteenth aspect of this invention provides an information transmission method of transmitting a sequence of code words which is generated by the modulation method in the first aspect of this invention.

A seventeenth aspect of this invention provides an information transmission apparatus for transmitting a sequence of code words which is generated by the modulation apparatus in the sixth aspect of this invention.

An eighteenth aspect of this invention provides a method of recording auxiliary information. The method comprises the steps of generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; sequentially connecting the generated output code words into a sequence which follows run length limiting rules; and changing the run length limiting rules between RLL(1, 7) and RLL(1, 8) in response to auxiliary information to superimpose the auxiliary information on the sequence of the generated output code words; wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

A nineteenth aspect of this invention is based on the eighteenth aspect thereof, and provides a method wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising the steps of generating a first candidate current output code word in response to a current input code word equal to one of the prescribed input code words by referring to the first specified one of the encoding tables, and generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

A twentieth aspect of this invention is based on the nineteenth aspect thereof, and provides a method further comprising the step of selecting one from the first and second candidate current output code words as a final current output code word.

A twenty-first aspect of this invention is based on the nineteenth aspect thereof, and provides a method further comprising the steps of calculating a first CDS of the first candidate current output code word; updating a first DSV of the first candidate current output code word and previous final output code words in response to the first CDS; calculating a second CDS of the second candidate current output code word; updating a second DSV of the second candidate current output code word and previous final output code words in response to the second CDS; determining which of an absolute value of the first DSV and an absolute value of the second DSV is smaller; and selecting one from the first and second candidate current output code words which corresponds to the smaller DSV absolute value as a final current output code word.

A twenty-second aspect of this invention is based on the eighteenth aspect thereof, and provides a method further comprising the steps of predicting repetition of a minimum run length at least a predetermined number of times in the sequence of the generated output code words; and when the repetition of the minimum run length is predicted, changing an output code word causing the repetition to prevent the repetition of the minimum run length from occurring in the sequence of the generated output code words.

A twenty-third aspect of this invention provides an apparatus for recording auxiliary information. The apparatus comprises means for generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; means for sequentially connecting the generated output code words into a sequence which follows run length limiting rules; and means for changing the run length limiting rules between RLL(1, 7) and RLL(1, 8) in response to auxiliary information to superimpose the auxiliary information on the sequence of the generated output code words; wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

A twenty-fourth aspect of this invention is based on the twenty-third aspect thereof, and provides an apparatus wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising means for generating a first candidate current output code word in response to a current input code word equal to one of the prescribed input code words by referring to the first specified one of the encoding tables, and means for generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

A twenty-fifth aspect of this invention is based on the twenty-fourth aspect thereof, and provides an apparatus further comprising means for selecting one from the first and second candidate current output code words as a final current output code word.

A twenty-sixth aspect of this invention is based on the twenty-fourth aspect thereof, and provides an apparatus further comprising means for calculating a first CDS of the first candidate current output code word; means for updating a first DSV of the first candidate current output code word and previous final output code words in response to the first CDS; means for calculating a second CDS of the second candidate current output code word; means for updating a second DSV of the second candidate current output code word and previous final output code words in response to the second CDS; means for determining which of an absolute value of the first DSV and an absolute value of the second DSV is smaller; and means for selecting one from the first and second candidate current output code words which corresponds to the smaller DSV absolute value as a final current output code word.

A twenty-seventh aspect of this invention is based on the twenty-third aspect thereof, and provides an apparatus further comprising means for predicting repetition of a minimum run length at least a predetermined number of times in the sequence of the generated output code words; and means for, when the repetition of the minimum run length is predicted, changing an output code word causing the repetition to prevent the repetition of the minimum run length from occurring in the sequence of the generated output code words.

A twenty-eighth aspect of this invention provides a method of reproducing an auxiliary information from a sequence of 6-bit code words which is generated by the recording method in the eighteenth aspect of this invention. The reproducing method comprises the steps of recovering encoding-table designation information from the code-word sequence, the encoding-table designation information representing which of encoding tables has been used in generating a code word immediately following a code word of interest; and demodulating the code word of interest into an original code word by referring to a decoding table in response to the recovered encoding-table designation information.

A twenty-ninth aspect of this invention is based on the twenty-eighth aspect thereof, and provides a method further comprising the steps of detecting whether the code-word sequence corresponds to (1, 7)RLL or (1, 8)RLL; and reproducing auxiliary information in response to a result of detecting whether the code-word sequence corresponds to (1, 7)RLL or (1, 8)RLL.

A thirtieth aspect of this invention provides an apparatus for reproducing an auxiliary information from a sequence of 6-bit code words which is generated by the recording apparatus in the twenty-third aspect of this invention. The reproducing apparatus comprises means for recovering encoding-table designation information from the code-word sequence, the encoding-table designation information representing which of encoding tables has been used in generating a code word immediately following a code word of interest; and means for demodulating the code word of interest into an original code word by referring to a decoding table in response to the recovered encoding-table designation information.

A thirty-first aspect of this invention is based on the thirtieth aspect thereof, and provides an apparatus further comprising means for detecting whether the code-word sequence corresponds to (1, 7)RLL or (1, 8)RLL; and means for reproducing auxiliary information in response to a result of detecting whether the code-word sequence corresponds to (1, 7)RLL or (1, 8)RLL.

A thirty-second aspect of this invention provides a recording medium storing a sequence of code words which is generated by the recording apparatus in the twenty-third aspect of this invention.

A thirty-third aspect of this invention provides a transmission apparatus for transmitting a sequence of code words which is generated by the recording apparatus in the twenty-third aspect of this invention.

A thirty-fourth aspect of this invention provides a transmission method of transmitting a sequence of code words which is generated by the recording method in the eighteenth aspect of this invention.

A thirty-fifth aspect of this invention provides a method of reproducing data from a sequence of 6-bit code words which is generated by the recording method in the eighteenth aspect of this invention. The reproducing method comprises the steps of recovering encoding-state information from the code-word sequence, the encoding-state information representing which of encoding tables has been used in generating a code word immediately following a code word of interest; demodulating the code word of interest into an original code word by referring to a decoding table in response to the generated encoding-state information; reproducing auxiliary information from the code-word sequence; and executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to a URL address related to contents information, 10) playback of character information, 11) playback of an auxiliary-picture information, 12) playback of audio visual information, and 13) authentication as to whether or not a recording medium is legitimate.

A thirty-sixth aspect of this invention is based on the thirty-fifth aspect thereof, and provides a method wherein the auxiliary-information reproducing step comprises the steps of detecting whether the code-word sequence corresponds to (1, 7)RLL or (1, 8)RLL; and reproducing the auxiliary information in response to a result of detecting whether the code-word sequence corresponds to (1, 7)RLL or (1, 8)RLL.

A thirty-seventh aspect of this invention provides an apparatus for reproducing data from a sequence of 6-bit code words which is generated by the recording apparatus in the twenty-third aspect of this invention. The reproducing apparatus comprises means for recovering encoding-state information from the code-word sequence, the encoding-state information representing which of encoding tables has been used in generating a code word immediately following a code word of interest; means for demodulating the code word of interest into an original code word by referring to a decoding table in response to the generated encoding-state information; means for reproducing auxiliary information from the code-word sequence; and means for executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to a URL address related to contents information, 10) playback of character information, 11) playback of an auxiliary-picture information, 12) playback of audio visual information, and 13) authentication as to whether or not a recording medium is legitimate.

A thirty-eighth aspect of this invention is based on the thirty-seventh aspect thereof, and provides an apparatus wherein the auxiliary-information reproducing means comprises means for detecting whether the code-word sequence corresponds to (1, 7)RLL or (1, 8)RLL; and means for reproducing the auxiliary information in response to a result of detecting whether the code-word sequence corresponds to (1, 7)RLL or (1, 8)RLL.

A thirty-ninth aspect of this invention provides a modulation apparatus comprising means for generating a final 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; means for generating a first candidate current output code word in response to a current input code word equal to one of prescribed input code words by referring to one of first and second specified encoding tables among the encoding tables which is designated by encoding-table designation information accompanying an immediately-preceding final output code word; means for generating a second candidate current output code word in response to the current input code word equal to said one of the prescribed input code words by referring to the other of the first and second specified encoding tables under conditions where a succession of the second candidate current output code word and the immediately-preceding final output code word follows a run length limiting rule; means for calculating a first DSV from the first candidate current output code word and previous final output code words; means for calculating a second DSV from the second candidate current output code word and previous final output code words; means for determining which of an absolute value of the first DSV and an absolute value of the second DSV is smaller; means for selecting one from the first and second candidate current output code words which corresponds to the smaller DSV absolute value as a final current output code word; and means for changing the run length limiting rule to change a maximum run length in a sequence of final output code words in response to auxiliary information to superimpose the auxiliary information on the sequence of the final output code words.

A fortieth aspect of this invention is based on the thirty-ninth aspect thereof, and provides a modulation apparatus wherein the sequence of the final output code words represents encryption-resultant main information, and the auxiliary information contains an information piece for decrypting the encryption-resultant main information.

A forty-first aspect of this invention is based on the thirty-ninth aspect thereof, and provides a modulation apparatus wherein the sequence of the final output code words represents scrambling-resultant main information, and the auxiliary information contains an information piece for descrambling the scrambling-resultant main information.

A forty-second aspect of this invention provides a demodulation apparatus comprising means for recovering encoding-state information from a sequence of code words, the encoding-state information representing which of encoding tables has been used in generating a code word immediately following every code word of interest; means for demodulating the code word of interest into an original code word by referring to a decoding table in response to the generated encoding-state information; means for detecting a frequency of occurrence of a specified run length in the sequence of code words; and means for reproducing auxiliary information from the sequence of code words in response to the detected occurrence frequency.

A forty-third aspect of this invention is based on the forty-second aspect thereof, and provides a demodulation apparatus further comprising means for decrypting encryption-resultant main information represented by a sequence of original code words in response to the reproduced auxiliary information.

A forty-fourth aspect of this invention is based on the forty-second aspect thereof, and provides a demodulation apparatus further comprising means for descrambling scrambling-resultant main information represented by a sequence of original code words in response to the reproduced auxiliary information.

BRIEF DESCRIPTION OF THE DRAWINGS

FIG. 1 is a diagram of 6-bit output code words which follow (1, 7)RLL or (1, 8)RLL.

FIG. 2 is a diagram of an encoding table for converting every 4-bit input code word into a 6-bit output code word which is used in a modulation apparatus according to a first embodiment of this invention.

FIG. 3 is a diagram of another encoding table which can be used instead of the encoding table in FIG. 2.

FIG. 5 is a diagram of an example of the relation among recording sectors, states of a maximum-run-length setting signal, and maximum run lengths Tmax.

FIG. 7 is a diagram of an example of five successive input code words D(k), five successive current-table selection numbers S(k) for designating sub encoding tables used in encoding the input code words D(k), five successive output code words C(k) assigned to the input code words D(k), and fiver successive next-table selection numbers S(k+1) accompanying the output code words C(k).

FIG. 9 is a time-domain diagram of a succession of output code words C(k−1), C(k)0, and C(k+1) being "010000", "101001", and "000001", and the result of NRZI conversion of the output code words C(k−1), C(k)0, and C(k+1).

FIG. 10 is a time-domain diagram of a succession of output code words C(k−1), C(k)1, and C(k+1) being "010000", "001001", and "000001", and the result of NRZI conversion of the output code words C(k−1), C(k)1, and C(k+1).

FIG. 15 is a diagram of an example of the contents of a decoding table used in a main-information decoder in FIG. 4.

FIG. 20 is a diagram of a calculator for generating auxiliary information from basic information pieces.

FIG. 21 is a block diagram of an information processing system according to a fifth embodiment of this invention.

FIG. 22 is a block diagram of an illegitimate information processing system.

DETAILED DESCRIPTION OF THE INVENTION

First Embodiment

Figure 4:
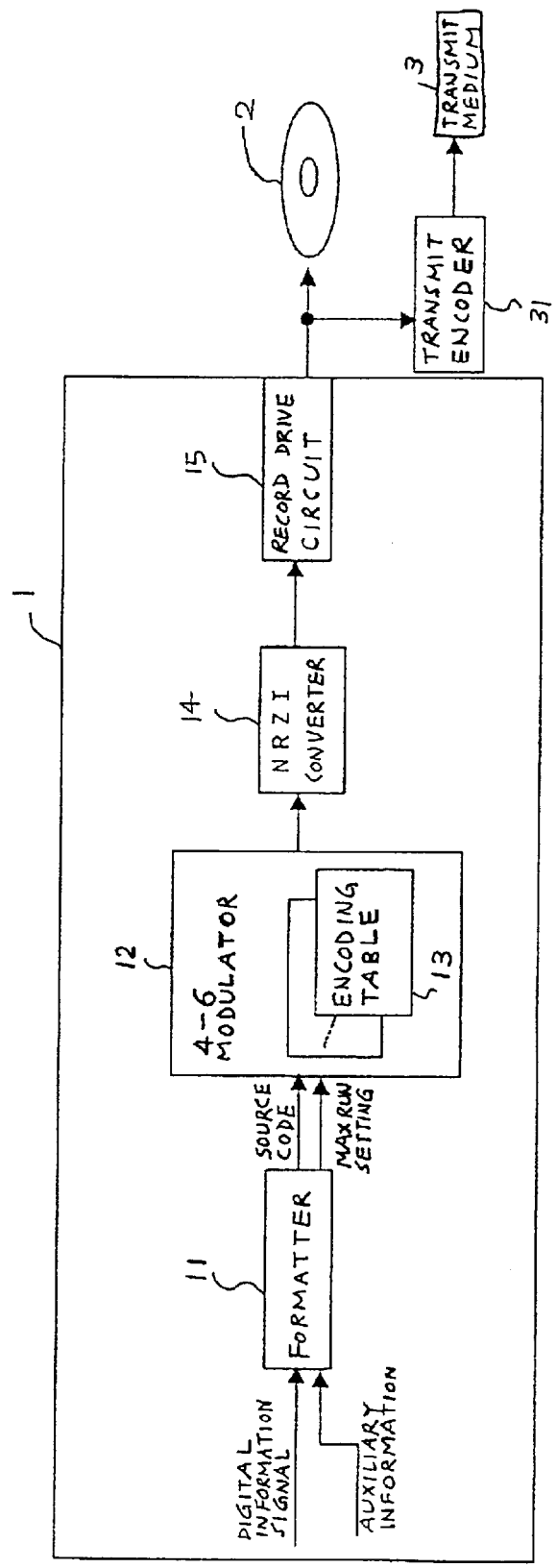
FIG. 4 is a block diagram of the modulation apparatus according to the first embodiment of this invention.

Run length limiting rules "(d, k)RLL" are such that "d" to "k" successive bits of "0" should be between bits of "1" in a modulation-resultant bit stream, where "d" and "k" denote predetermined natural numbers and the number "d" is smaller than the number "k".

FIG. 1 shows 6-bit output code words which follow (1, 7)RLL or (1, 8)RLL. FIG. 2 shows an encoding table for converting or encoding every 4-bit input code word (every 4-bit input data word) into a 6-bit output code word. The encoding table in FIG. 2 uses 6-bit output code words listed in FIG. 1.

The encoding table in FIG. 2 has a set of four sub encoding tables having identification (ID) numbers of "0", "1", "2", and "3" respectively. Each of the four sub encoding tables stores 6-bit output code words C(k) assigned to 4-bit input code words D(k). The four sub encoding tables contain arrays of cells at different addresses respectively. Each of the cells has a set of an input code word D(k), an output code word C(k) assigned to the input code word D(k), and a number S(k+1) assigned to the output code word C(k). In FIG. 2, each input code word D(k) is expressed by the decimal notation while each output code word C(k) is expressed by both the decimal notation and the binary notation. In FIG. 2, each output code word C(k) is followed by and accompanied with a number S(k+1) which designates a sub encoding table used next. Under normal conditions, when the number S(k+1) accompanying the current output code word is "0", the sub encoding table having an ID number of "0" is used to generate a next output code word. When the number S(k+1) accompanying the current output code word is "1", the sub encoding table having an ID number of "1" is used to generate a next output code word. When the number S(k+1) accompanying the current output code word is "2", the sub encoding table having an ID number of "2" is used to generate a next output code word. When the number S(k+1) accompanying the current output code word is "3", the sub encoding table having an ID number of "3" is used to generate a next output code word. The numbers S(k+1) are referred to as the next-table selection numbers S(k+1). The next-table selection numbers S(k+1) are designed so that a sequence of selected output code words will follow (1, 7)RLL or (1, 8)RLL. A next-table selection number accompanying an output code word C(k−1) immediately preceding the current output code word C(k) is defined as a current-table selection number S(k) used for generation of the current output code word C(k) in response to the current input code word D(k).

The sub encoding table having an ID number of "1" and the sub encoding table having an ID number of "2" are in a predetermined relation as follows. The NRZI modulation results (the NRZI conversion results) of output code words assigned to prescribed input code words in the sub encoding table having an ID number of "1" are opposite in polarity ("odd-even" in the number of "1", that is, DSV-related polarity) to those of output code words in the sub encoding table having an ID number of "2". The opposite polarities cause a DSV (digital sum variation) in an increasing direction and a DSV in a decreasing direction, respectively. As mentioned later, in the case where the sub encoding table having an ID number of "2" is originally designated and a current input code word is identical with such a prescribed one, two output code words are read out from the sub encoding table having an ID number of "2" and the sub encoding table having an ID number of "1" as two candidate output code words respectively. In this case, one is selected from the two candidate output code words as a final output code word in response to DSV calculation results.

The sub encoding table having an ID number of "1" and the sub encoding table having an ID number of "3" are in a predetermined relation as follows. The NRZI modulation results of output code words assigned to prescribed input code words in the sub encoding table having an ID number of "1" are opposite in DSV-related polarity to those of output code words in the sub encoding table having an ID number of "3". The opposite polarities cause a DSV in an increasing direction and a DSV in a decreasing direction, respectively. As mentioned later, in the case where the sub encoding table having an ID number of "3" is originally designated and a current input code word is identical with such a prescribed one, two output code words are read out from the sub encoding table having an ID number of "3" and the sub encoding table having an ID number of "1" as two candidate output code words respectively. In this case, one is selected from the two candidate output code words as a final output code word in response to DSV calculation results.

The sub encoding table having an ID number of "0" and the sub encoding table having an ID number of "2" are in a predetermined relation as follows. The NRZI modulation results of output code words assigned to prescribed input code words in the sub encoding table having an ID number of "0" are opposite in DSV-related polarity to those of output code words in the sub encoding table having an ID number of "2". The opposite polarities cause a DSV in an increasing direction and a DSV in a decreasing direction, respectively. As mentioned later, in the case where the sub encoding table having an ID number of "2" is originally designated and a current input code word is identical with such a prescribed one, two output code words are read out from the sub encoding table having an ID number of "2" and the sub encoding table having an ID number of "0" as two candidate output code words respectively. In this case, one is selected from the two candidate output code words as a final output code word in response to DSV calculation results.

The sub encoding table having an ID number of "0" and the sub encoding table having an ID number of "3" are in a predetermined relation as follows. The NRZI modulation results of output code words assigned to prescribed input code words in the sub encoding table having an ID number of "0" are opposite in DSV-related polarity to those of output code words in the sub encoding table having an ID number of "3". The opposite polarities cause a DSV in an increasing direction and a DSV in a decreasing direction, respectively. As mentioned later, in the case where the sub encoding table having an ID number of "3" is originally designated and a current input code word is identical with such a prescribed one, two output code words are read out from the sub encoding table having an ID number of "3" and the sub encoding table having an ID number of "0" as two candidate output code words respectively. In this case, one is selected from the two candidate output code words as a final output code word in response to DSV calculation results.

In the four sub encoding tables of FIG. 2, each of some output code words is assigned in common to a plurality of input code words, and the common output code words in the respective cells are accompanied with different next-table selection numbers S(k+1) respectively. This design is advantageous in reducing the volume of the encoding table. The assignment of next-table selection numbers S(k+1) to output code words follows predetermined rules. Next-table selection numbers S(k+1) accompanying transmitted output code words are not positively transmitted to a decoder side (a demodulation side). The decoder side utilizes the predetermined assignment rules, and thereby recovers a next-table selection number S(k+1) accompanying a code word of interest and then uses the recovered next-table selection number S(k+1) in decoding the code word of interest rather than decoding a code word immediately following the code word of interest. This design simplifies the decoding procedure.

FIG. 3 shows an encoding table which is similar to the encoding table in FIG. 2 except for assignment of output code words C(k) to input code words D(k). The encoding table in FIG. 3 may be used instead of the encoding table in FIG. 2.

The encoding table in FIG. 2 or FIG. 3 is designed for conversion of a 4-bit input code word into a 6-bit output code word. Since doubling a 4-bit input code word and a 6-bit output code word results in an 8-bit input code word and a 12-bit output code word, an encoding table for converting an 8-bit input code word into a 12-bit output code word can be made on the basis of the encoding table in FIG. 2 or FIG. 3. Accordingly, this invention contains 8–12 modulation in addition to 4–6 modulation.

FIG. 4 shows a modulation apparatus 1 according to a first embodiment of this invention. As shown in FIG. 4, the modulation apparatus 1 includes a formatter 11, a 4–6 modulator 12, an NRZI (non-return-to-zero invert) converter 14, and a recording and driving circuit 15 which are sequentially connected in that order.

The formatter 11 receives a digital information signal (an input digital signal). The input digital signal represents main information such as video information, audio information, or audio visual information. The formatter 11 adds an error correction code signal to the received digital information signal, and sectors and makes the addition-resultant signal into a second digital signal of a predetermined control format conforming with a recording format used by a recording medium 2. The formatter 11 outputs the second digital signal to the 4–6 modulator 12. The second digital signal is also referred to as the source code signal. The source code signal has a sequence of 4-bit input code words.

Furthermore, the formatter 11 receives auxiliary information together with the input digital signal (the main information). The auxiliary information comes from a suitable source (not shown). The formatter 11 assigns the auxiliary information to a bit of "0" or a bit of "1" for every recording sector (or every signal block different from a recording sector), thereby converting the auxiliary information into a maximum-run-length setting signal. The formatter 11 may add an error correction code signal to the maximum-run-length setting signal. The formatter 11 outputs the maximum-run-length setting signal to the 4–6 modulator 12.

As shown in FIG. 5, the maximum-run-length setting signal includes a binary signal which assumes either "1" or "0" for every recording sector. The 4–6 modulator 12 responds to the maximum-run-length setting signal. When the maximum-run-length setting signal is "1", the 4–6 modulator 12 implements modulation with a run length limiting procedure designed to equalize a maximum run length Tmax of the NRZI-modulation-resultant signal except a sync to a first prescribed value, for example, "9" (9T), and to equalize a minimum run length Tmin thereof to "2" (2T). Here, T denotes the length or period of one bit (one channel bit). In this case, the run length limiting rules providing the run length range of 2T–9T are effected. The effected run length limiting rules correspond to the before-NRZI-conversion rules "RLL(1, 8)". When the maximum-run-length setting signal is "0", the 4–6 modulator 12 implements modulation with a run length limiting procedure designed to equalize the maximum run length Tmax to a second prescribed value, for example, "8" (8T), and to equalize the minimum run length Tmin to "2" (2T). In this case, the run length limiting rules providing the run length range of 2T–8T are effected. The effected run length limiting rules correspond to the before-NRZI-conversion rules "RLL (1, 7)".

It should be noted that auxiliary information which assumes either "1" or "0" for every recording sector may be directly fed to the 4–6 modulator 12. In this case, the 4–6 modulator 12 responds to the directly-fed auxiliary information.

It should be noted that the first prescribed value may be equal to "10" (10T) or more. The second prescribed value may differ from "8" (8T). Preferably, the first and second prescribed values are equal to "13" (13T) or less. More preferably, the first and second prescribed values are in the range of "8" to "13" (8T to 13T). For example, 2048 bytes of the input digital signal are assigned to one recording sector. Another number of bytes of the input digital signal may be assigned to one recording sector.

The 4–6 modulator 12 includes an encoding table 13 using the encoding table in FIG. 2. Alternatively, the encoding table 13 may use the encoding table in FIG. 3. The 4–6 modulator 12 subjects the second digital signal (the source code signal) to 4–6 modulation by referring to the encoding table 13 in response to the maximum-run-length setting signal. Thereby, the 4–6 modulator 12 converts the second digital signal into a third digital signal. In addition, the 4–6 modulator 12 adds a sync word to the third digital signal for every frame (sync frame). A given number of sync frames compose one recording sector. The 4–6 modulator 12 outputs the third digital signal to the NRZI converter 14.

The NRZI converter 14 subjects the third digital signal (the output digital signal from the 4–6 modulator 12) to NRZI modulation, thereby converting the third digital signal into a fourth digital signal which is of an NRZI code. The NRZI converter 14 outputs the fourth digital signal to the recording and driving circuit 15. The recording and driving circuit 15 records the fourth digital signal (the output digital signal from the NRZI converter 14) on a recording medium 2 via a recording head.

The fourth digital signal can be fed to a transmission encoder 31 from the recording and driving circuit 15. The device 31 encodes the fourth digital signal into a fifth digital signal which is of a code suited for transmission. The transmission encoder 31 outputs the fifth digital signal to a transmission medium 3. The fifth digital signal propagates along the transmission medium 3.

Figure 6:
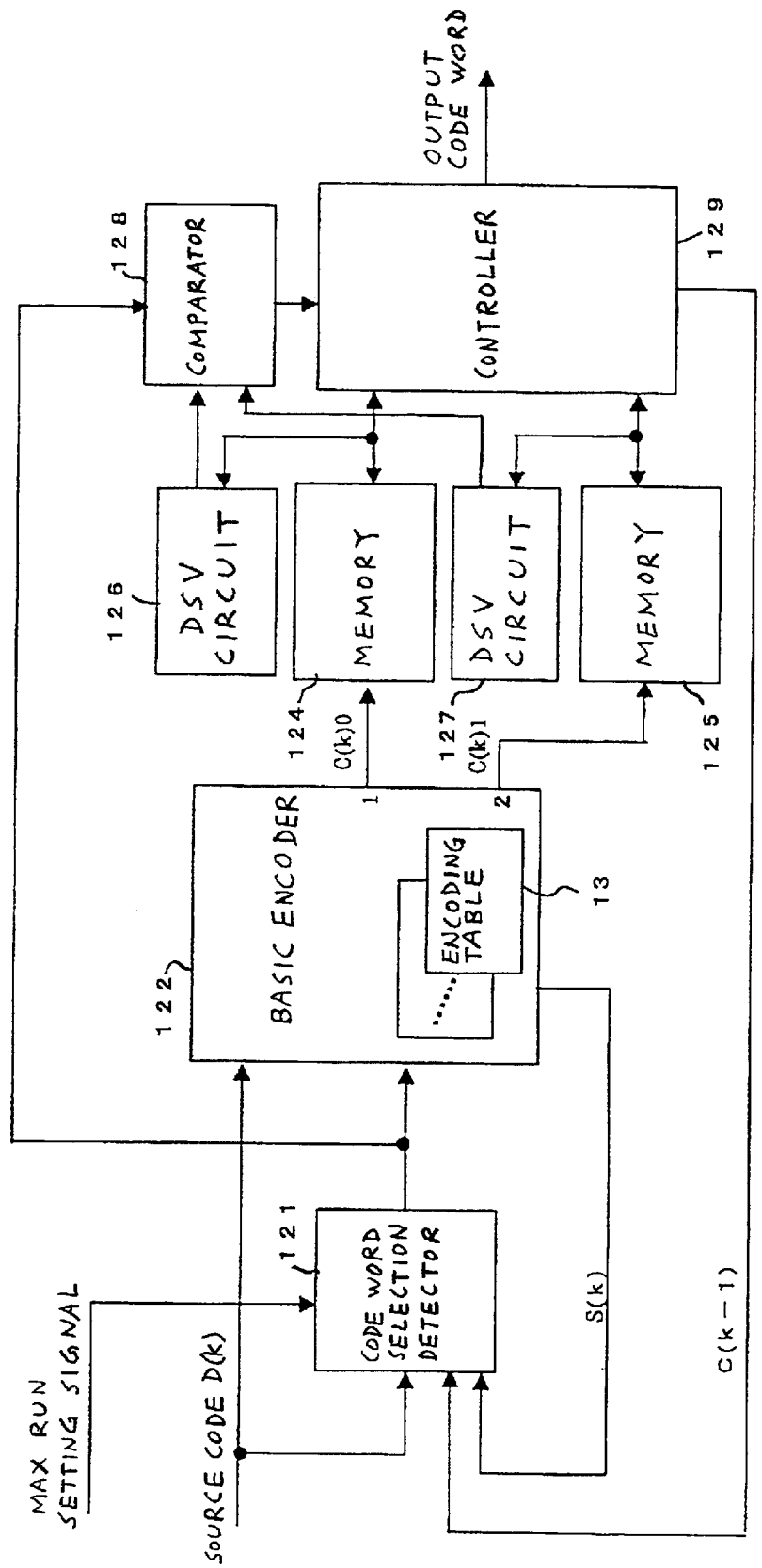
FIG. 6 is a block diagram of a 4–6 modulator in FIG. 4.

As shown in FIG. 6, the 4–6 modulator 12 includes two memories 124 and 125 in paths "0" and "1" respectively. The path memories 124 and 125 are also referred to as the code word memories. The 4–6 modulator 12 further includes a code-word selection detector 121 and a basic encoder 122. The code-word selection detector 121 is connected with the basic encoder 122. The basic encoder 122 is connected with the path memories 124 and 125.

The basic encoder 122 receives the source code signal from the formatter 11. The basic encoder 122 handles every 4-bit block of the source code signal as an input code word. The basic encoder 122 includes the encoding table 13 used for converting or encoding every 4-bit input code word into a 6-bit output code word. The basic encoder 122 also includes an address generator for producing an address signal in response to every 4-bit input code word. The address signal designates one of the cells in the encoding table 13 which should be accessed.

The 4–6 modulator 12 further includes DSV circuits 126 and 127, a comparator 128, and a controller 129. The DSV circuit 126 is connected with the path memory 124, the comparator 128, and the controller 129. The DSV circuit 127 is connected with the path memory 125, the comparator 128, and the controller 129. The comparator 128 is connected with the code-word selection detector 121 and the controller 129. The controller 129 is connected with the path memories 124 and 125. The controller 129 is followed by the NRZI converter 14 (see FIG. 4).

The 4–6 modulator 12 operates as follows. The basic encoder 122 receives the source code signal from the formatter 11. The basic encoder 122 handles every 4-bit block of the source code signal as an input code word D(k). In addition, the basic encoder 122 implements frame-by-frame signal processing. Here, "frame" means a sync frame corresponding to each prescribed segment of the source code signal. A given number of sync frames compose one recording sector. The basic encoder 122 has an initial table in addition to the encoding table 13. The initial table contains a predetermined sync word (a predetermined sync bit pattern) and a predetermined initial value of an adopted next-table selection number S(k+1). During a start of every frame, the basic encoder 122 accesses the initial table, and reads out the sync word and the initial value therefrom. The basic encoder 122 outputs the read-out sync word to the next stage, that is, the path memories 124 and 125. The basic encoder 122 stores the read-out sync word into the path memories 124 and 125. The basic encoder 122 sets the adopted next-table selection number S(k+1) to the read-out initial value. The basic encoder 122 delays a signal representative of the adopted next-table selection number S(k+1) by a time interval corresponding to one word, thereby generating a signal representative of a current-table selection number S(k). First, the current-table selection number S(k) is equal to the initial value. Thereafter, the current-table selection number S(k) is equal to a next-table selection number accompanying an immediately-previous output code word C(k−1). The basic encoder 122 outputs the signal of the current-table selection number S(k) to the code-word selection detector 121.

The code-word selection detector 121 receives the source code signal from the formatter 11. The code-word selection detector 121 handles every 4-bit block of the source code signal as a current input code word D(k). The code-word selection detector 121 receives the signal of the current-table selection number S(k) from the basic encoder 122. First, the current-table section number S(k) is equal to the initial value. In addition, the code-word selection detector 121 is informed by the controller 129 of a latest output code word C(k−1) which has been finally selected and decided. The code-word selection detector 121 receives the maximum-run-length setting signal from the formatter 11. The code-word selection detector 121 detects whether or not an output code word corresponding to the current input code word D(k) is uniquely decided, that is, whether or not selecting one from candidate output code words as a final output code word corresponding to the current input code word D(k) is required on the basis of the current input code word D(k), the current-table selection number S(k), the latest selected output code word C(k−1), and the maximum-run-length setting signal. The code-word selection detector 121 outputs a signal representative of a result of the detection to the basic encoder 122 and the comparator 128. In more detail, the code-word selection detector 121 decides whether or not the current input code word D(k), the current-table selection number S(k), and the latest selected output code word C(k−1) are in prescribed conditions depending on the maximum-run-length setting signal. When the current input code word D(k), the current-table selection number S(k), and the latest selected output code word C(k−1) are in the prescribed conditions, the code-word selection detector 121 outputs a detection-result signal (a code-word selection signal) indicating that code-word selection is required. Otherwise, the code-word selection detector 121 outputs a detection-result signal (a code-word non-selection signal) indicating that code-word selection is not required.

In the case where the detection-result signal outputted from the code-word selection detector 121 indicates that code-word selection is required, the basic encoder 122 takes two candidate output code words C(k)0 and C(k)1 for the current input code word D(k). Specifically, the basic encoder 122 generates two different addresses in response to the current input code word D(k) and the current-table selection number S(k), and accesses two of the four sub encoding tables in response to the generated addresses. One of the two accessed sub encoding tables has an ID number equal to the current-table selection number S(k). The basic encoder 122 reads out an output code word C(k)0 assigned to the current input code word D(k) from the sub encoding table having an ID number equal to the current-table selection number S(k). The read-out output code word C(k)0 is defined as the first candidate output code word C(k)0. The basic encoder 122 reads out an output code word C(k)1 assigned to the current input code word D(k) from the other accessed sub encoding table. The read-out output code word C(k)1 is defined as the second candidate output code word C(k)1. The candidate output code words C(k)0 and C(k)1 are assigned to the path "0" and the path "1", respectively. The basic encoder 122 stores the candidate output code words C(k)0 and C(k)1 into the path memories 124 and 125, respectively.

In the case where the detection-result signal outputted from the code-word selection detector 121 indicates that code-word selection is not required, the basic encoder 122 takes only one output code word C(k) for the current input code word D(k). Specifically, the basic encoder 122 generates only one address in response to the current input code word D(k) and the current-table selection number S(k), and accesses one of the four sub encoding tables in response to the generated address. The accessed sub encoding table has an ID number equal to the current-table selection number S(k). The basic encoder 122 reads out an output code word C(k) assigned to the current input code word D(k) from the sub encoding table having an ID number equal to the current-table selection number S(k). The basic encoder 122 stores the output code word C(k) into the path memory 124 as a first candidate output code word C(k)0. The basic encoder 122 stores the output code word C(k) into the path memory 125 as a second candidate output code word C(k)1. In this way, the same output code word C(k) is written into the path memories 124 and 125. The basic encoder 122 updates the adopted next-table selection number S(k+1) to the value accompanying the output code word C(k).

The DSV circuit 126 calculates a CDS (code digital sum) value of the output code word C(k)0 in the path memory 124, and updates a DSV value of the output code word C(k)0 and previous output code words in response to the calculated CDS value. The DSV circuit 126 has a memory loaded with a signal representative of the updating-resultant DSV value (the newest DSV value). The DSV value provided by the DSV circuit 126 relates to the path "0". Similarly, the DSV circuit 127 calculates a CDS (code digital sum) value of the output code word C(k)1 in the path memory 125, and updates a DSV value of the output code word C(k) and previous output code words in response to the calculated CDS value. The DSV circuit 127 has a memory loaded with a signal representative of the updating-resultant DSV value (the newest DSV value). The DSV value provided by the DSV circuit 127 relates to the path "1".

The comparator 128 responds to the detection-result signal outputted from the code-word selection detector 121. In the case where the detection-result signal indicates that code-word selection is required, the comparator 128 accesses the memories within the DSV circuits 126 and 127. The comparator 128 calculates the absolute newest DSV value (the first absolute DSV value) stored in the memory within the DSV circuit 126. The comparator 128 calculates the absolute newest DSV value (the second absolute DSV value) stored in the memory within the DSV circuit 127. The device 128 compares the first and second absolute DSV values to decide which of the two is smaller. The comparator 128 notifies the result of the comparison to the controller 129. In the case where the detection-result signal indicates that code-word selection is not required, the comparator 128 is inactive and does not notify any comparison result to the controller 129.

When the comparison result notified by the comparator 128 indicates that the first absolute DSV value is smaller than the second absolute DSV value, the controller 129 reads out the output code word C(k)0 from the path memory 124. The controller 129 transmits the read-out output code word C(k)0 to the NRZI converter 14 as a finally-selected output code word. The controller 129 informs the code-word selection detector 121 of the read-out output code word as the latest selected output code word C(k−1). In addition, the controller 129 replaces the contents of the output code word C(k)1 in the path memory 125 with the contents of the output code word C(k)0. Thus, in this case, the contents of the output code word C(k)1 in the path memory 125 are updated to the contents of the output code word C(k)0 in the path memory 124. Furthermore, the controller 129 reads out the DSV value from the memory within the DSV circuit 126, and updates the DSV value in the memory within the DSV circuit 127 to the read-out DSV value. Thus, in this case, the DSV value in the memory within the DSV circuit 127 is set to the DSV value in the memory within the DSV circuit 126. In addition, the controller 129 informs the basic encoder 122 that the output code word C(k)0 has been selected. The basic encoder 122 updates the adopted next-table selection number S(k+1) to the value accompanying the output code word C(k)0.

When the comparison result notified by the comparator 128 indicates that the first absolute DSV value is equal to or greater than the second absolute DSV value, the controller 129 reads out the output code word C(k)1 from the path memory 125. The controller 129 transmits the read-out output code word C(k)1 to the NRZI converter 14 as a finally-selected output code word. The controller 129 informs the code-word selection detector 121 of the read-out output code word as the latest selected output code word C(k−1). In addition, the controller 129 replaces the contents of the output code word C(k)0 in the path memory 124 with the contents of the output code word C(k)1. Thus, in this case, the contents of the output code word C(k)0 in the path memory 124 are updated to the contents of the output code word C(k)1 in the path memory 125. Furthermore, the controller 129 reads out the DSV value from the memory within the DSV circuit 127, and updates the DSV value in the memory within the DSV circuit 126 to the read-out DSV value. Thus, in this case, the DSV value in the memory within the DSV circuit 126 is set to the DSV value in the memory within the DSV circuit 127. In addition, the controller 129 informs the basic encoder 122 that the output code word C(k)1 has been selected. The basic encoder 122 updates the adopted next-table selection number S(k+1) to the value accompanying the output code word C(k)1.

In this way, one corresponding to the smaller absolute DSV value is selected from the candidate output code words C(k)0 and C(k)1 as a final output code word. Therefore, DSV control is implemented.

In the absence of the comparison result notified by the comparator 128, the controller 129 reads out the output code word C(k)0 from the path memory 124. The controller 129 transmits the read-out output code word C(k)0 to the NRZI converter 14 as a finally-selected output code word. The controller 129 informs the code-word selection detector 121 of the read-out output code word as the latest selected output code word C(k−1). In this case, the controller 129 does not access the path memory 125 and the DSV circuits 126 and 127.

It should be noted that the number of candidate output code words may be three or more. In this case, one of the candidate output code words which corresponds to the smallest DSV value is selected as a final output code word. First and second sequences of output code words corresponding to all input code words may be stored in the path memories 124 and 125. In this case, after an end input code word has been modulated, the controller 129 selects one from the first and second sequences of output code words in the path memories 124 and 125 and transmits the selected sequence to the NRZI converter 14.

The 4–6 modulator 12 responds to the maximum-run-length setting signal. When the maximum-run-length setting signal is "0", the 4–6 modulator 12 implements such modulation as to effect (1, 7)RLL with respect to a modulation-resultant bit stream. On the other hand, when the maximumrun-length setting signal is "1", the 4–6 modulator 12 implements such modulation as to effect (1, 8)RLL with respect to a modulation-resultant bit stream. Accordingly, the output digital signal from the 4–6 modulator 12 can be changed between the type corresponding to (1, 7)RLL and the type corresponding to (1, 8)RLL in response to the maximum-run-length setting signal. In other words, the auxiliary information corresponding to the maximum-run-length setting signal is superimposed on the output digital signal from the 4–6 modulator 12 (the main information).

FIG. 7 shows an example of five successive input code words. With reference to FIG. 7, there is a sequence of input code words of "4", "5", "6", "7", and "8" (decimal). According to the modulation using (1, 7)RLL, the sequence of input code words is encoded into a sequence of output code words as follows. At an initial stage, the current-table selection number S(k) is set to an initial value of, for example, "0". Thus, the sub encoding table having an ID number of "0" is accessed for the first input code word "4", and an output code word of "18" (decimal) equal to "010010" (binary) which is assigned to the first input code word "4" is read out from the accessed sub encoding table (see FIG. 2). The bit sequence "010010" is outputted. At the same time, a number S(k+1) of "1" which accompanies the output code word "010010" is read out from the accessed sub encoding table. Then, the current-table selection number S(k) is updated to the read-out value "1". Thus, the sub encoding table having an ID number of "1" is accessed for the second input code word "5", and an output code word of "2" (decimal) equal to "000010" (binary) which is assigned to the second input code word "5" is read out from the accessed sub encoding table (see FIG. 2). The bit sequence "000010" is outputted. At the same time, a number S(k+1) of "2" which accompanies the output code word "000010" is read out from the accessed sub encoding table. Then, the current-table selection number S(k) is updated to the read-out value "2". Thus, the sub encoding table having an ID number of "2" is accessed for the third input code word "6", and an output code word of "18" (decimal) equal to "010010" (binary) which is assigned to the third input code word "6" is read out from the accessed sub encoding table (see FIG. 2). The bit sequence "010010" is outputted. At the same time, a number S(k+1) of "3" which accompanies the output code word "000010" is read out from the accessed sub encoding table. Then, the current-table selection number S(k) is updated to the read-out value "3". Thus, the sub encoding table having an ID number of "3" is accessed for the fourth input code word "7", and an output code word of "21" (decimal) equal to "010101" (binary) which is assigned to the fourth input code word "7" is read out from the accessed sub encoding table (see FIG. 2). The bit sequence "010101" is outputted. At the same time, a number S(k+1) of "0" which accompanies the output code word "010101" is read out from the accessed sub encoding table. Then, the current-table selection number S(k) is updated to the read-out value "0". Thus, the sub encoding table having an ID number of "0" is accessed for the fifth input code word "8", and an output code word of "21" (decimal) equal to "010101" (binary) which is assigned to the fifth input code word "8" is read out from the accessed sub encoding table (see FIG. 2). The bit sequence "010101" is outputted. At the same time, a number S(k+1) of "1" which accompanies the output code word "010101" is read out from the accessed sub encoding table. Then, the current-table selection number S(k) is updated to the read-out value "1".

In this way, a sequence of input code words of "4", "5", "6", "7", and "8" is converted into a sequence of output code words as "010010", "000010", "010010", "010101", and "010101". A bit stream formed by sequentially direct connection of the output code words is "010010000010010010010101010101". This bit stream follows (1, 7)RLL.

The code-word selection detector 121 may be formed by a digital signal processor, a CPU, or a similar device including a combination of an input/output port, a processing section, a ROM, and a RAM. In this case, the code-word selection detector 121 operates in accordance with a control program stored in the ROM. The control program has a main routine and first and second subroutines (first and second segments). The first and second subroutines (the first and second segments) are designed for (1, 7)RLL and (1, 8)RLL, respectively. The main routine checks the logical state of the maximum-run-length setting signal. When the maximum-run-length setting signal is "0" which corresponds to (1, 7)RLL, the main routine selects the first subroutine (the first segment) and causes the execution thereof. On the other hand, when the maximum-run-length setting signal is "1" which corresponds to (1, 8)RLL, the main routine selects the second subroutine (the second segment) and causes the execution thereof.

Figure 8:
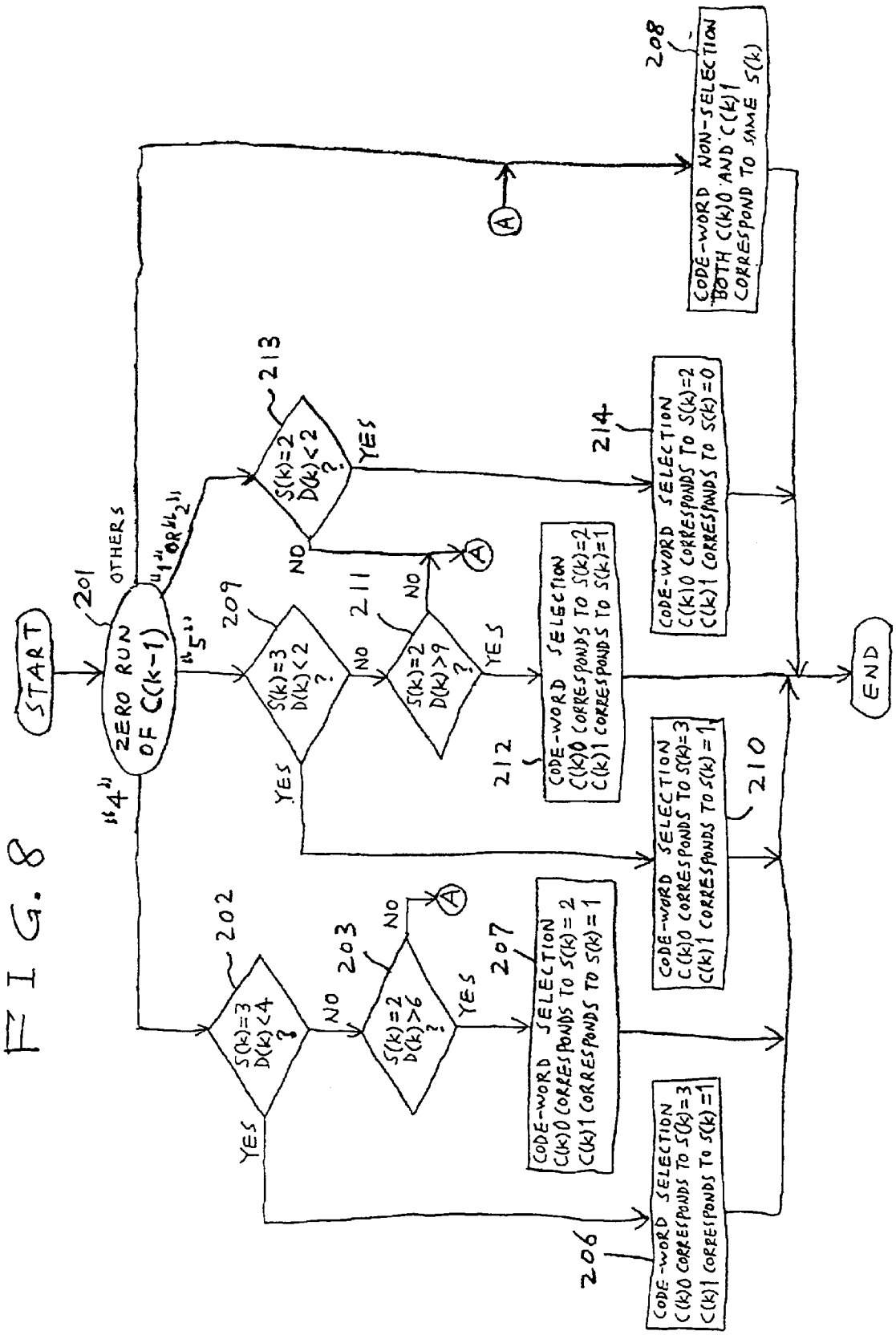
FIG. 8 is a flowchart of a first segment of a control program for a code-word selection detector in FIG. 6.

FIG. 8 is a flowchart of the first segment of the control program for the code-word selection detector 121 which is executed for every input code word. The program segment in FIG. 8 is designed for (1, 7)RLL. With reference to FIG. 8, a first step 201 of the program segment detects the zero run length of the LSB side of the latest selected output code word C(k−1). The latest selected output code word C(k−1) is fed from the controller 129. The step 201 decides which of predetermined values the detected LSB-side zero run length of the latest selected output code word C(k−1) is equal to. When the detected LSB-side zero run length of the latest selected output code word C(k−1) is equal to "4", that is, when the latest selected output code word C(k−1) is "010000", the program advances from the step 201 to a step 202. When the detected LSB-side zero run length of the latest selected output code word C(k−1) is equal to "5", that is, when the latest selected output code word C(k−1) is "100000", the program advances from the step 201 to a step 209. When the detected LSB-side zero run length of the latest selected output code word C(k−1) is equal to "1" or "2", that is, when the latest selected output code word C(k−1) is "010100", "000100", "100100", "010010", "000010", "001010", "101010", or "100010", the program advances from the step 201 to a step 213. In other cases, the program advances from the step 201 to a step 208.

The step 202 checks the current input code word D(k) and the current-table selection number S(k). The current-table selection number S(k) is notified by the basic encoder 122. The step 202 decides whether or not the current-table selection number S(k) is "3" and the current input code word D(k) is less than "4" (decimal). In other words, the step 202 decides whether or not the current-table selection number S(k) is "3" and the current input code word D(k) is in the range of "0" to "3" (decimal). When the current-table selection number S(k) is "3" and the current input code word D(k) is in the range of "0" to "3", the program advances from the step 202 to a step 206. Otherwise, the program advances from the step 202 to a step 203.

The step 203 decides whether or not the current-table selection number S(k) is "2" and the current input code word D(k) is greater than "6" (decimal). When the current table-table selection number S(k) is "2" and the current input code word D(k) is greater than "6", the program advances from the step 203 to a step 207. Otherwise, the program advances from the step 202 to the step 208.

The step 209 checks the current input code word D(k) and the current-table selection number S(k). The step 209 decides whether or not the current-table selection number S(k) is "3" and the current input code word D(k) is less than "2" (decimal). In other words, the step 209 decides whether or not the current-table selection number S(k) is "3" and the current input code word D(k) is in the range of "0" to "1" (decimal). When the current-table selection number S(k) is "3" and the current input code word D(k) is in the range of "0" to "1", the program advances from the step 209 to a step 210. Otherwise, the program advances from the step 209 to a step 211.

The step 211 decides whether or not the current-table selection number S(k) is "2" and the current input code word D(k) is greater than "9" (decimal). When the current-table selection number S(k) is "2" and the current input code word D(k) is greater than "9", the program advances from the step 211 to a step 212. Otherwise, the program advances from the step 211 to the step 208.

The step 213 checks the current input code word D(k) and the current-table selection number S(k). The step 213 decides whether or not the current-table selection number S(k) is "2" and the current input code word D(k) is less than "2" (decimal). In other words, the step 213 decides whether or not the current-table selection number S(k) is "2" and the current input code word D(k) is in the range of "0" to "1" (decimal). When the current-table selection number S(k) is "2" and the current input code word D(k) is in the range of "0" to "1", the program advances from the step 213 to a step 214. Otherwise, the program advances from the step 213 to the step 208.

The step 206 generates a code-word selection signal designed for using the sub encoding table in the basic encoder 122 which has an ID number of "3" to generate a first candidate output code word C(k)0, and for using the sub encoding table in the basic encoder 122 which has an ID number of "1" to generate a second candidate output code word C(k)1. The step 206 outputs the generated code-word selection signal. After the step 206, the current execution cycle of the program segment ends.

The step 207 generates a code-word selection signal designed for using the sub encoding table in the basic encoder 122 which has an ID number of "2" to generate a first candidate output code word C(k)0, and for using the sub encoding table in the basic encoder 122 which has an ID number of "1" to generate a second candidate output code word C(k)1. The step 207 outputs the generated code-word selection signal. After the step 207, the current execution cycle of the program segment ends.

The step 210 generates a code-word selection signal designed for using the sub encoding table in the basic encoder 122 which has an ID number of "3" to generate a first candidate output code word C(k)0, and for using the sub encoding table in the basic encoder 122 which has an ID number of "1" to generate a second candidate output code word C(k)1. The step 210 outputs the generated code-word selection signal. After the step 210, the current execution cycle of the program segment ends.

The step 212 generates a code-word selection signal designed for using the sub encoding table in the basic encoder 122 which has an ID number of "2" to generate a first candidate output code word C(k)0, and for using the sub encoding table in the basic encoder 122 which has an ID number of "1" to generate a second candidate output code word C(k)1. The step 212 outputs the generated code-word selection signal. After the step 212, the current execution cycle of the program segment ends.

The step 214 generates a code-word selection signal designed for using the sub encoding table in the basic encoder 122 which has an ID number of "2" to generate a first candidate output code word C(k)0, and for using the sub encoding table in the basic encoder 122 which has an ID number of "0" to generate a second candidate output code word C(k)1. The step 214 outputs the generated code-word selection signal. After the step 214, the current execution cycle of the program segment ends.

The step 208 generates a code-word non-selection signal. The step 208 outputs the generated code-word non-selection signal. After the step 208, the current execution cycle of the program segment ends.

In the case where the latest selected output code word C(k−1) is "010000" and the current-table selection number S(k) is "3", and where the current input code word D(k) is in the range of "0" to "3" (decimal), when the originally-designated sub encoding table having an ID number of "3" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "010000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 202, and 206.

In the case where the latest selected output code word C(k−1) is "010000" and the current-table selection number S(k) is "2", and where the current input code word D(k) is greater than "6" (decimal), when the originally-designated sub encoding table having an ID number of "2" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "010000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 203, and 207.

In the case where the latest selected output code word C(k−1) is "100000" and the current-table selection number S(k) is "3", and where the current input code word D(k) is in the range of "0" to "1" (decimal), when the originally-designated sub encoding table having an ID number of "3" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "100000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 209, and 210.

In the case where the latest selected output code word C(k−1) is "100000" and the current-table selection number S(k) is "2", and where the current input code word D(k) is greater than "9" (decimal), when the originally-designated sub encoding table having an ID number of "2" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "100000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 211, and 212.

In the case where the latest selected output code word C(k−1) has an LSB-side zero run length of "1" or "2" and the current-table selection number S(k) is "2", and where the current input code word D(k) is less than "2" (decimal), when the originally-designated sub encoding table having an ID number of "2" is used to generate an output code word C(k), a resultant succession of the output code words C(k−1) and C(k) follows (1, 7) RLL. In this case, even when the sub encoding table having an ID number of "0" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "1", "2", or "3" will be used to generate an output code word C(k) immediately following the output code word C(k−1) having an LSB-side zero run length of "1" or "2". In the sub encoding tables having ID numbers of "0", "1", "2", and "3", output code words assigned to a same input code word of "0" or "1" (decimal) are different from each other. Therefore, using the sub encoding table having an ID number of "0" instead of the originally-designated sub encoding table will not cause a problem in a decoding side. This case corresponds to the combination of the steps 205, 213, and 214.

DSV control is implemented as follows. In the case where the latest selected output code word C(k−1) is "010000" and the current-table selection number S(k) is "3", and where the current input code word D(k) is "0" (decimal), the originally-designated sub encoding table having an ID number of "3" and also the sub encoding table having an ID number of "1" are accessed. Output code words assigned to the current input code word D(k) are read out from the accessed sub encoding tables. The output code word read out from the sub coding table having an ID number of "3" is set as a first candidate output code word C(k)0. The output code word read out from the sub coding table having an ID number of "1" is set as a second candidate output code word C(k)1. The first candidate output code word C(k)0 is "101001" while the second candidate output code word C(k)1 is "001001". It is assumed that a next output code word C(k+1) is "000001". FIG. 9 shows a succession of the output code words C(k−1), C(k)0, and C(k+1), that is, "010000", "101001", and "000001". FIG. 9 also shows the result of NRZI conversion of the output code words C(k−1), C(k)0, and C(k+1). FIG. 10 shows a succession of the output code words C(k−1), C(k)1, and C(k+1), that is, "010000", "001001", and "000001". FIG. 10 also shows the result of NRZI conversion of the output code words C(k−1), C(k)1, and C(k+1). As shown in FIG. 9, the result of NRZI conversion of the first candidate output code word C(k)0 is "111000". As shown in FIG. 10, the result of NRZI conversion of the second candidate output code word C(k)1 is "001111". Therefore, the first and second candidate output code words C(k)0 and C(k)1 cause different DSV-related polarities regarding the NRZI conversion results respectively. Thus, the first and second candidate output code words C(k)0 and C(k)1 cause different DSV values respectively. As previously mentioned, one of the first and second candidate output code words C(k)0 and C(k)1 which causes the smaller DSV value is selected as a final output code word C(k). The code-word selection provides DSV control of suppressing a DC component of a modulation-resultant bit stream.

Figure 11:
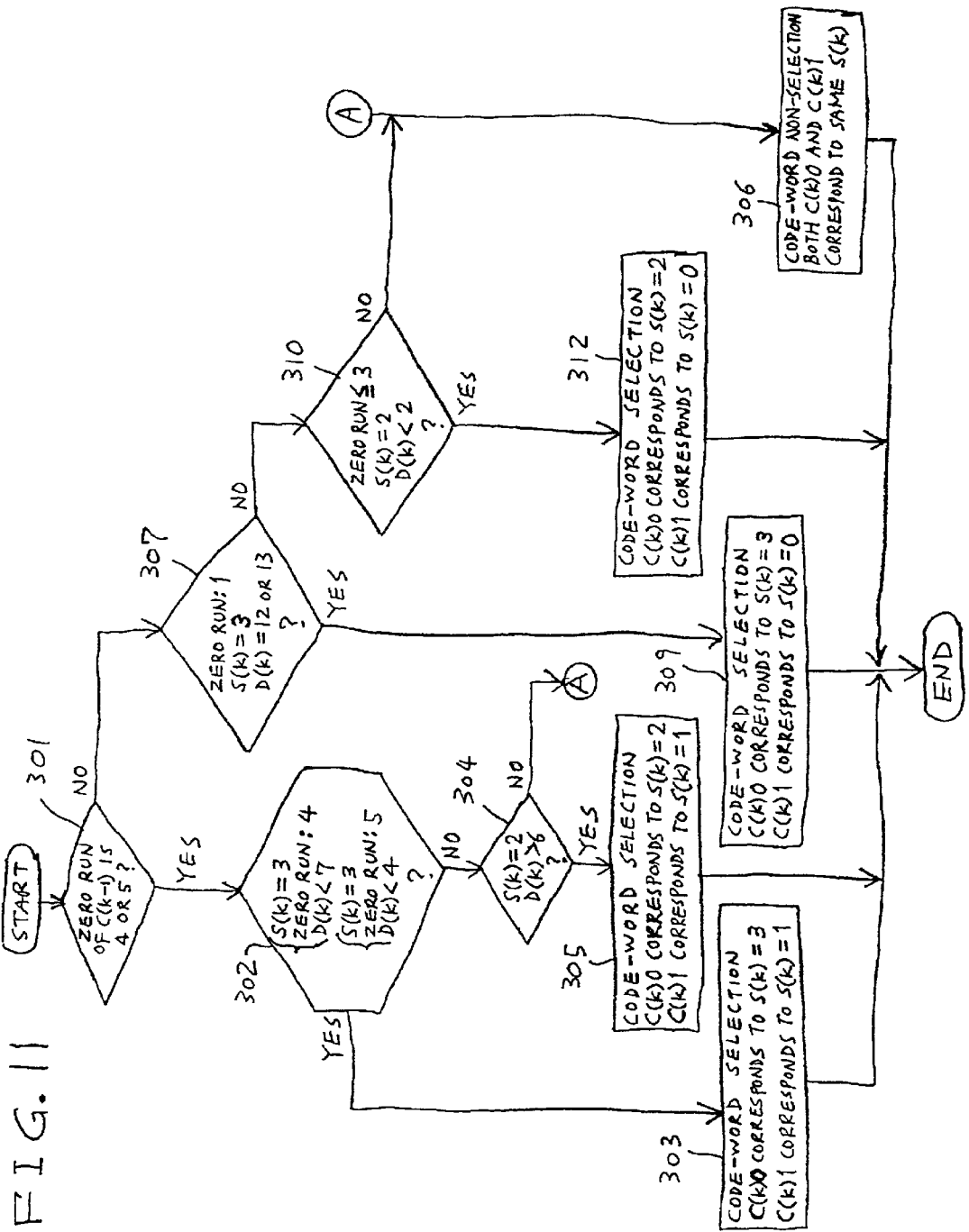
FIG. 11 is a flowchart of a second segment of the control program for the code-word selection detector in FIG. 6.

FIG. 11 is a flowchart of the second segment of the control program for the code-word selection detector 121 which is executed for every input code word. The program segment in FIG. 11 is designed for (1, 8)RLL. With reference to FIG. 11, a first step 301 of the program segment detects the zero run length of the LSB side of the latest selected output code word C(k−1). The latest selected output code word C(k−1) is fed from the controller 129. The step 301 decides whether or not the detected LSB-side zero run length of the latest selected output code word C(k−1) is in the range of "4" to "5". When the detected LSB-side zero run length of the latest selected output code word C(k−1) is in the range of "4" to "5", the program advances from the step 301 to a step 302. Otherwise, the program advances from the step 301 to a step 307.

The step 302 checks the current input code word D(k) and the current-table selection number S(k). The current-table selection number S(k) is notified by the basic encoder 122. The step 302 decides whether or not all the following conditions C1, C2, and C3 are satisfied. C1: The detected LSB-side zero run length of the latest selected output code word C(k−1) is equal to "4". C2: The current-table selection number S(k) is "3". C3: The current input code word D(k) is less than "7" (decimal). When all the conditions C1, C2, and C3 are satisfied, the program advances from the step 302 to a step 303. In addition, the step 302 decides whether or not all the following conditions D1, D2, and D3 are satisfied. D1: The detected LSB-side zero run length of the latest selected output code word C(k−1) is equal to "5". D2: The current-table selection number S(k) is "3". D3: The current input code word D(k) is less than "4" (decimal). When all the conditions D1, D2, and D3 are satisfied, the program advances from the step 302 to the step 303. In other cases, the program advances from the step 302 to a step 304.

The step 304 checks the current input code word D(k) and the current-table selection number S(k). The step 304 decides whether or not the current-table selection number S(k) is "2" and the current input code word D(k) is greater than "6" (decimal). When the current-table selection number S(k) is "2" and the current input code word D(k) is greater than "6", the program advances from the step 304 to a step 305. Otherwise, the program advances from the step 304 to a step 306.

The step 307 detects the zero run length of the LSB side of the latest selected output code word C(k−1). The step 307 checks the current input code word D(k) and the current-table selection number S(k). The step 307 decides whether or not all the following conditions E1, E2, and E3 are satisfied. E1: The detected LSB-side zero run length of the latest selected output code word C(k−1) is equal to "1". E2: The current-table selection number S(k) is "3". E3: The current input code word D(k) is "12" or "13" (decimal). When all the conditions E1, E2, and E3 are satisfied, the program advances from the step 307 to a step 309. Otherwise, the program advances from the step 307 to a step 310.

The step 310 detects the zero run length of the LSB side of the latest selected output code word C(k−1). The step 310 checks the current input code word D(k) and the current-table selection number S(k). The step 310 decides whether or not all the following conditions F1, F2, and F3 are satisfied. F1: The detected LSB-side zero run length of the latest selected output code word C(k−1) is equal to or less than "3". F2: The current-table selection number S(k) is "2". F3: The current input code word D(k) is less than "2" (decimal). When all the conditions F1, F2, and F3 are satisfied, the program advances from the step 310 to a step 312. Otherwise, the program advances from the step 310 to the step 306.

The step 303 generates a code-word selection signal designed for using the sub encoding table in the basic encoder 122 which has an ID number of "3" to generate a first candidate output code word C(k)0, and for using the sub encoding table in the basic encoder 122 which has an ID number of "1" to generate a second candidate output code word C(k)1. The step 303 outputs the generated code-word selection signal. After the step 303, the current execution cycle of the program segment ends.

The step 305 generates a code-word selection signal designed for using the sub encoding table in the basic encoder 122 which has an ID number of "2" to generate a first candidate output code word C(k)0, and for using the sub encoding table in the basic encoder 122 which has an ID number of "1" to generate a second candidate output code word C(k)1. The step 305 outputs the generated code-word selection signal. After the step 305, the current execution cycle of the program segment ends.

The step 309 generates a code-word selection signal designed for using the sub encoding table in the basic encoder 122 which has an ID number of "3" to generate a first candidate output code word C(k)0, and for using the sub encoding table in the basic encoder 122 which has an ID number of "0" to generate a second candidate output code word C(k)1. The step 309 outputs the generated code-word selection signal. After the step 309, the current execution cycle of the program segment ends.

The step 312 generates a code-word selection signal designed for using the sub encoding table in the basic encoder 122 which has an ID number of "2" to generate a first candidate output code word C(k)0, and for using the sub encoding table in the basic encoder 122 which has an ID number of "0" to generate a second candidate output code word C(k)1. The step 312 outputs the generated code-word selection signal. After the step 312, the current execution cycle of the program segment ends.

The step 306 generates a code-word non-selection signal. The step 306 outputs the generated code-word non-selection signal. After the step 306, the current execution cycle of the program segment ends.

The code-word selection signal generated and outputted by the step 303, 305, 309, or 312 enables DSV control to be implemented. Preferably, during every recording sector for which the modulation corresponding to (1, 8)RLL is executed, DSV control is started and effected only after the number of times of occurrence of a maximum run length of "9T" in a modulation-resultant bit stream reaches a predetermined constant value. In this case, the code-word selection detector 121 includes a counter for detecting the number of times of occurrence of a maximum run length of "9T".

The 4–6 modulator 12 may be formed by a digital signal processor, a CPU, or a similar device including a combination of an input/output port, a processing section, a ROM, and a RAM. In this case, the 4–6 modulator 12 operates in accordance with a control program stored in the ROM. The encoding table 13 and the initial table are provided in the ROM while the path memories 124 and 125, and the memories within the DSV circuits 126 and 127 are provided in the RAM.

Figure 12:
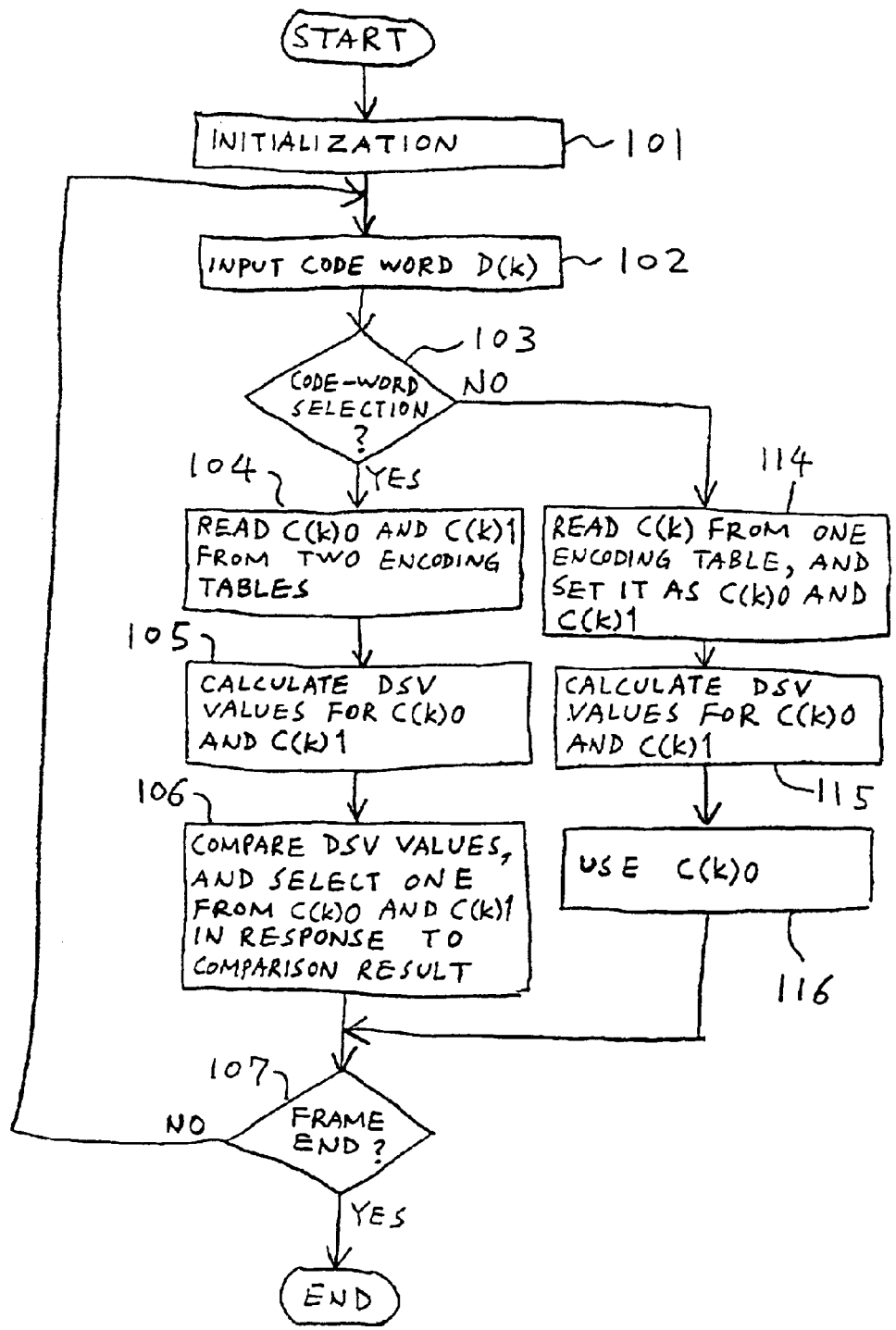
FIG. 12 is a flowchart of a segment of a control program for the 4–6 modulator in FIG. 4.

FIG. 12 is a flowchart of a segment of the control program for the 4–6 modulator 12. The program segment in FIG. 12 is executed for every sync frame. As shown in FIG. 12, a first step 101 of the program segment reads out the initial value from the initial table. The step 101 sets the current-table selection number S(k) to the read-out initial value. The step 101 initializes the DSV values (the path-0 and path-1 DSV values). After the step 101, the program advances to a step 102.

The step 102 receives a current input code word D(k). A step 103 following the step 102 decides whether or not prescribed conditions for code-word selection are satisfied, that is, whether or not code-word selection should be implemented. The prescribed conditions correspond to the conditions for code-word selection in FIG. 8 (or FIG. 11). Thus, the prescribed conditions relate to the detected LSB-side zero run length of a latest selected output code word C(k−1), the current-table selection number S(k), and the current input code word D(k). When the prescribed conditions are satisfied, that is, when code-word selection should be implemented, the program advances from the step 103 to a step 104. Otherwise, the program advances from the step 103 to a step 114.

The step 104 chooses two among the sub encoding tables which should be accessed. A first sub encoding table to be accessed has an ID number equal to the current-table selection number S(k). A second sub encoding table to be accessed has an ID number determined by the prescribed conditions used in the step 103. The step 104 reads out an output code word C(k)0 assigned to the current input code word D(k) from the first chosen sub encoding table. The step 104 reads out an output code word C(k)1 assigned to the current input code word D(k) from the second chosen sub encoding table. The read-out output code word C(k)0 is defined as the first candidate output code word C(k)0 assigned to the path "0". The read-out output code word C(k)1 is defined as the second candidate output code word C(k)1 assigned to the path "1".

A step 105 following the step 104 calculates a CDS value of the first candidate output code word C(k)0, and updates the path-0 DSV value of the first candidate output code word C(k)0 and previous output code words in response to the calculated CDS value. In addition, the step 105 calculates a CDS value of the second candidate output code word C(k)1, and updates the path-1 DSV value of the second candidate output code word C(k)1 and previous output code words in response to the calculated CDS value.

A step 106 subsequent to the step 105 calculates the absolute path-0 DSV value and the absolute path-1 DSV value. The step 106 compares the absolute path-0 DSV value and the absolute path-1 DSV value to decide which of the two is smaller. When the absolute path-0 DSV value is smaller than the absolute path-1 DSV value, the step 106 outputs the first candidate output code word C(k)0 as a finally-selected output code word. In addition, the step 106 replaces the contents of the second output code word C(k)1 with the contents of the first output code word C(k)0. Furthermore, the step 106 equalizes the path-1 DSV value to the path-0 DSV value. Also, the step 106 sets the current-table selection number S(k) to the value accompanying the first candidate output code word C(k)0. On the other hand, when the absolute path-0 DSV value is equal to or greater than the absolute path-1 DSV value, the step 106 outputs the second candidate output code word C(k)1 as a finally-selected output code word. In addition, the step 106 replaces the contents of the first output code word C(k)0 with the contents of the second output code word C(k)1. Furthermore, the step 106 equalizes the path-0 DSV value to the path-1 DSV value. Also, the step 106 sets the current-table selection number S(k) to the value accompanying the second candidate output code word C(k)1. After the step 106, the program advances to a step 107.

The step 114 accesses the sub encoding table having an ID number equal to the current-table selection number S(k). The step 114 reads out an output code word C(k) assigned to the current input code word D(k) from the accessed sub encoding table. The read-out output code word C(k) is defined as the first candidate output code word C(k)0 assigned to the path "0" and also the second candidate output code word C(k)1 assigned to the path "1".

A step 115 following the step 114 calculates a CDS value of the first candidate output code word C(k)0, and updates the path-0 DSV value of the first candidate output code word C(k)0 and previous output code words in response to the calculated CDS value. In addition, the step 115 calculates a CDS value of the second candidate output code word C(k)1, and updates the path-1 DSV value of the second candidate output code word C(k)1 and previous output code words in response to the calculated CDS value.

A step 116 subsequent to the step 115 outputs the first candidate output code word C(k)0 as a finally-selected output code word. In addition, the step 116 sets the current-table selection number S(k) to the value accompanying the first candidate output code word C(k)0. After the step 116, the program advances to the step 107.

The step 107 decides whether or not the current input code word D(k) corresponds to an end of a frame. When the current input code word D(k) corresponds to an end of a frame, the program exits from the step 107 and then the current execution cycle of the program segment ends. Otherwise, the program returns from the step 107 to the step 102.

In the case of a transmission line having low-frequency enhanced response characteristics, repetition of the minimum run length which has the shortest bit inversion period makes it difficult for a decoding side to acquire phase lock-up with respect to a received signal. Preferably, repetition of the minimum run length is prevented from occurring as will be mentioned hereafter.

According to the encoding table 13 in FIG. 2, recurrence of an output code word of "010101" or "101010" causes repetition of the minimum run length which has the shortest bit inversion period. Recurrence of an output code word of "010101" would appear in the case where an input code word D(k) continues to be "7" (decimal) after a current-table selection number S(k) is "0" or "3". Count is made as to the number of times of recurrence of the input code word D(k) and the current-table selection number S(k) which would cause repetition of the minimum run length. The count is to detect given conditions such that D(k+1)=7 and D(k+2)=7 after S(k)=0 and D(k)=7. The detection of the given conditions means the prediction of the occurrence of repetition of the minimum run length. In the case where the given conditions are detected, D(k+1)=10, 11, 12, 13, 14, or 15 is used instead of D(k+1)=7, and the setting is done as S(k+2)=0. In the sub encoding table having an ID number of "0", the input code word D(k+1) of "10", "11", "12", "13", "14", or "15" corresponds to an output code word C(k+1) accompanied with a next-table selection number of "2" or "3". The output code word C(k+1) has a bit pattern different from "010101". The adopted next-table selection number originally equal to "2" or "3" is changed to "0" so that the sub encoding table having an ID number of "0" is accessed in response to the input code word D(k+2). In the sub encoding table having an ID number of "0", the input code word D(k+2) of "7" corresponds to an output code word C(k+2) of "010101". This design enables the run length limiting rules to be satisfied, and also enables a decoding side to reproduce repetition of an original code word D(k) of "7" (decimal).

Recurrence of an output code word of "101010" would appear in the following given conditions. When S(k)=2 and D(k)=12, an output code word C(k) of "101010" is generated. The output code word C(k) is accompanied with a next-table selection number of "2". Then, an input code word D(k+1) of "12" comes, and an output code word C(k+1) of "101010" is generated. The output code word C(k+1) is accompanied with a next-table selection number of "2". Subsequently, an input code word D(k+2) of "12" comes, and an output code word C(k+2) of "101010" is generated. The given conditions are detected by counting the number of times of repetition of the input code word D(k) and the current-table selection number S(k) which would cause repetition of the minimum run length. The detection of the given conditions means the prediction of the occurrence of repetition of the minimum run length. In the case where the given conditions are detected, the adopted next-table selection number accompanying the output code word C(k) and being originally equal to "2" is changed to "0" so that the sub encoding table having an ID number of "0" is accessed in response to the input code word D(k+1). In the sub encoding table having an ID number of "0", the input code word D(k+1) of "12" corresponds to an output code word C(k+1) of "000000". This design enables the run length limiting rules to be satisfied, and also enables a decoding side to reproduce repetition of an original code word of "12".

Figure 13:
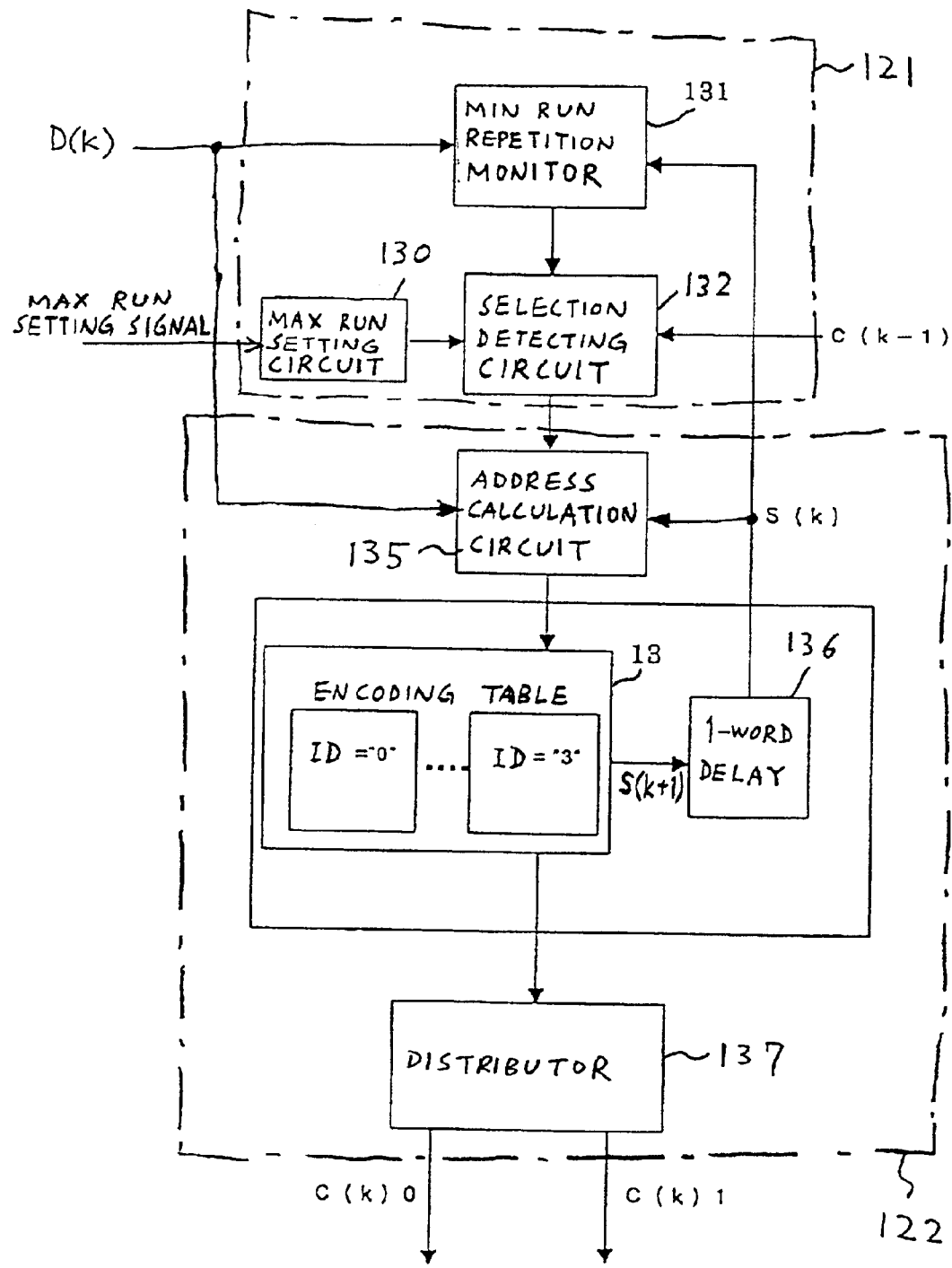
FIG. 13 is a block diagram of the code-word selection detector and a basic encoder in FIG. 6.

As shown in FIG. 13, the code-word selection detector 121 includes a maximum run length setting circuit 130, a minimum run repetition monitor 131, and a selection detecting circuit 132. The maximum run length setting circuit 130 is connected with the selection detecting circuit 132. The maximum run length setting circuit 130 receives the maximum-run-length setting signal from the formatter 11. The maximum run length setting circuit 130 generates information representative of desired run length limiting rules in response to the maximum-run-length setting signal. When the maximum-run-length setting signal is "0", the maximum run length setting circuit 130 informs the selection detecting circuit 132 that (1, 7)RLL are desired. On the other hand, when the maximum-run-length setting signal is "1", the maximum run length setting circuit 130 informs the selection detecting circuit 132 that (1, 8)RLL are desired. The minimum run repetition monitor 131 is connected with the selection detecting circuit 132. The minimum run repetition monitor 131 receives the input code word D(k). The minimum run repetition monitor 131 receives the current-table selection number S(k) from the basic encoder 122. The minimum run repetition monitor 131 detects whether or not the previously-mentioned given conditions occur by counting the number of times of repetition of the input code word D(k) and the current-table selection number S(k) which would cause repetition of the minimum run length. When it is detected that the given conditions occur, the minimum run repetition monitor 131 changes at least one of the input code word D(k) and the current-table selection number S(k) in the way same as the previously-mentioned one. The minimum run repetition monitor 131 informs the selection detecting circuit 132 of the change-resultant input code word D(k) and the change-resultant current-table selection number S(k). On the other hand, when it is detected that the given conditions do not occur, the minimum run repetition monitor 131 passes the input code word D(k) and the current-table selection number S(k) to the selection detecting circuit 132 without changing them. The selection detecting circuit 132 receives the latest selected output code word C(k−1) from the controller 129. The selection detecting circuit 132 detects whether or not an output code word corresponding to the input code word D(k) is uniquely decided, that is, whether or not selecting one from candidate output code words as a final output code word corresponding to the input code word D(k) is required on the basis of the input code word D(k), the current-table selection number S(k), the latest selected output code word C(k−1), and the desired run length limiting rules. In accordance with the results of the detection, the selection detecting circuit 132 outputs either a code-word selection signal or a code-word non-selection signal to the basic encoder 122. Specifically, when the desired run length limiting rules are (1, 7)RLL, the selection detecting circuit 132 executes a detection procedure corresponding to the program segment in FIG. 8. In this case, a modulation-resultant bit stream will follow (1, 7)RLL. On the other hand, when the desired run length limiting rules are (1, 8)RLL, the selection detecting circuit 132 executes a detection procedure corresponding to the program segment in FIG. 11. In this case, a modulation-resultant bit stream will follow (1, 8)RLL.

As shown in FIG. 13, the basic encoder 122 includes an address calculation circuit 135, a delay circuit 136, and a distributor 137 in addition to the encoding table 13. The address calculation circuit 135 receives the code-word selection signal or the code-word non-selection signal from the code-word selection detector 121. The address calculation circuit 135 receives the input code word D(k). Furthermore, the address calculation circuit 135 receives the current-table selection number S(k). The address calculation circuit 135 is connected with the encoding table 13. In the case where the code-word selection signal is outputted from the code-word selection detector 121, the address calculation circuit 135 computes and generates two different addresses in response to the input code word D(k) and the current-table selection number S(k). The address calculation circuit 135 outputs the generated addresses to the encoding table 13. Two of the four sub encoding tables within the encoding table 13 are accessed in response to the generated addresses. One of the two accessed sub encoding tables has an ID number equal to the current-table selection number S(k). An output code word C(k)0 assigned to the input code word D(k) is read out from the sub encoding table having an ID number equal to the current-table selection number S(k). The read-out output code word C(k)0 is defined as the first candidate output code word C(k)0. An output code word C(k)1 assigned to the current input code word D(k) is read out from the other accessed sub encoding table. The read-out output code word C(k)1 is defined as the second candidate output code word C(k)1. The encoding table 13 is connected with the delay circuit 136 and the distributor 137. The encoding table 13 outputs the first and second candidate output code words C(k)0 and C(k)1 to the distributor 137. The distributor 137 transmits the first candidate output code word C(k)0 to the path "0", that is, the path memory 124 (see FIG. 5). The distributor 137 transmits the second candidate output code word C(k)1 to the path "1", that is, the path memory 125 (see FIG. 5). As previously mentioned, one is selected from the first and second candidate output code words C(k)0 and C(k)1 as a final output code word C(k). A next-table selection number S(k+1) accompanying the finally-selected output code word C(k) is fed from the encoding table 13 to the delay circuit 136. The delay circuit 136 defers the next-table selection number S(k+1) by a time interval corresponding to one word, thereby generating the current-table selection number S(k). The delay circuit 136 informs the address calculation circuit 135 and the code-word selection detector 121 of the current-table selection number S(k).

In the case where the code-word non-selection signal is outputted from the code-word selection detector 121, the address calculation circuit 135 computes and generates only one address in response to the input code word D(k) and the current-table selection number S(k). The address calculation circuit 135 outputs the generated address to the encoding table 13. One of the four sub encoding tables within the encoding table 13 is accessed in response to the generated address. The accessed sub encoding tables has an ID number equal to the current-table selection number S(k). An output code word C(k)0 assigned to the input code word D(k) is read out from the sub encoding table having an ID number equal to the current-table selection number S(k). The read-out output code word C(k)0 is defined as the first candidate output code word C(k)0. Also, the read-out output code word C(k)0 is used as the second candidate output code word C(k)1. The encoding table 13 outputs the first and second candidate output code words C(k)0 and C(k)1 to the distributor 137. The distributor 137 transmits the first candidate output code word C(k)0 to the path "0", that is, the path memory 124 (see FIG. 5). The distributor 137 transmits the second candidate output code word C(k)1 to the path "1", that is, the path memory 125 (see FIG. 5). A next-table selection number S(k+1) accompanying the output code word C(k)0 is fed from the encoding table 13 to the delay circuit 136. The delay circuit 136 defers the next-table selection number S(k+1) by a time interval corresponding to one word, thereby generating the current-table selection number S(k). The delay circuit 136 informs the address calculation circuit 135 and the code-word selection detector 121 of the current-table selection number S(k).

With reference back to FIG. 5, maximum-run-length setting signals of "1", "0", "0", "1", and "1" are assigned to recording sectors "0", "1", "2", "3", and "4", respectively. For the recording sector "0", since the maximum-run-length setting signal is "1", the modulation with (1, 8)RLL is implemented and hence the maximum run length Tmax of the NRZI-modulation-resultant signal is equal to "9" (9T). For the recording sector "1", since the maximum-run-length setting signal is "0", the modulation with (1, 7)RLL is implemented and hence the maximum run length Tmax of the NRZI-modulation-resultant signal is equal to "8" (8T). Similarly, for the recording sector "2", the maximum run length Tmax is equal to "8" (8T). For the recording sectors "3" and "4", the maximum run length Tmax is equal to "9" (9T).

Second Embodiment

Figure 14:
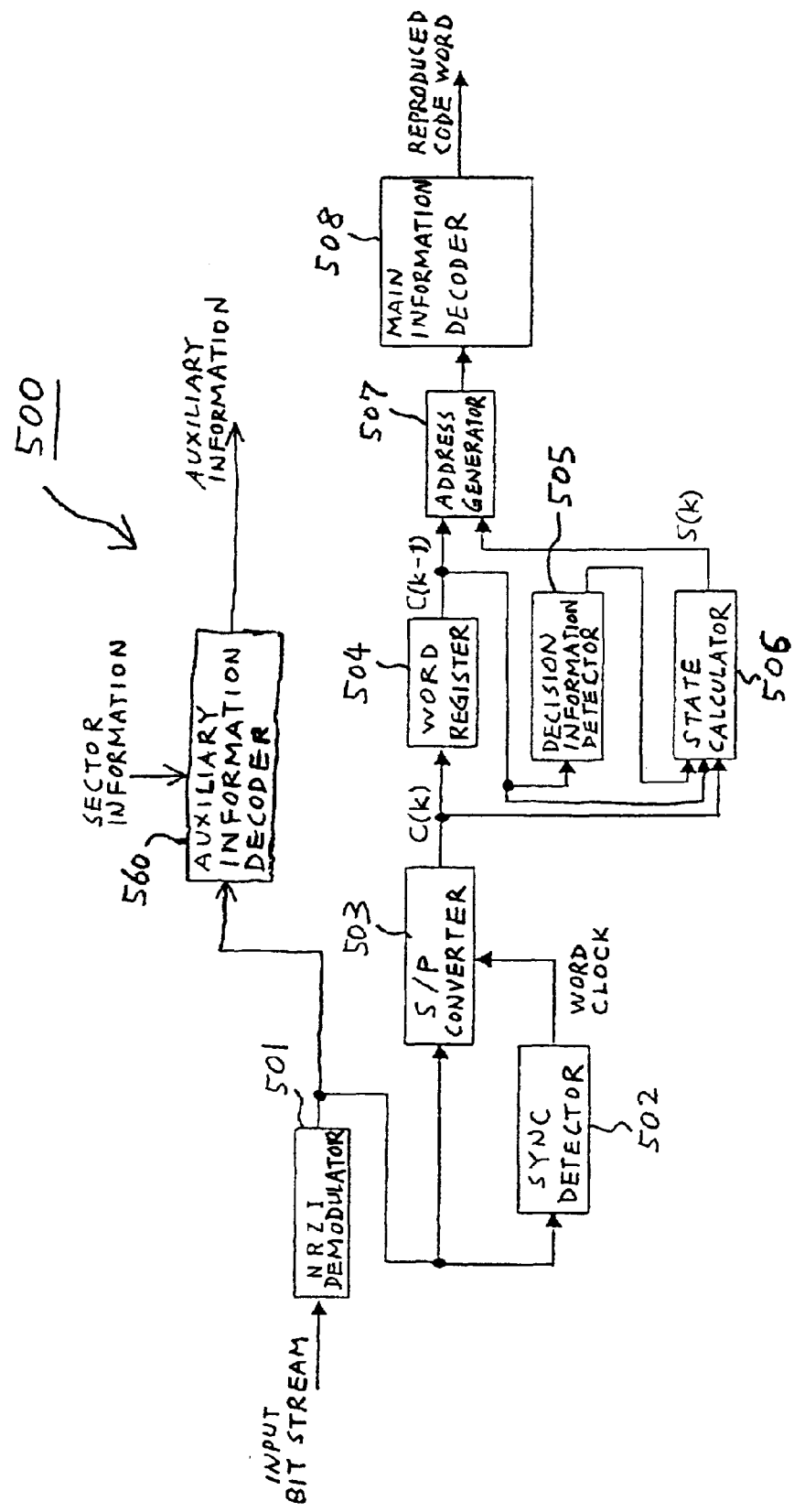
FIG. 14 is a block diagram of a demodulation apparatus according to a second embodiment of this invention.

FIG. 14 shows a demodulation apparatus 500 according to a second embodiment of this invention. The demodulation apparatus 500 receives an input bit stream divided into segments representative of input code words. The input bit stream is generated by, for example, the modulation apparatus 1 in FIG. 4. The input bit stream corresponds to, for example, the output signal of the NRZI converter 14 in FIG. 4. The demodulation apparatus 500 recovers main information and auxiliary information from the input bit stream. The demodulation apparatus 500 outputs the recovered main information and also the recovered auxiliary information. The demodulation apparatus 500 can reproduce original code words (the main information) from the input bit stream regardless of whether the run length limiting rules used by a modulation side are (1, 7)RLL or (1, 8)RLL.

As shown in FIG. 14, the demodulation apparatus 500 includes an NRZI demodulator 501, a sync detector 502, a serial-to-parallel (S/P) converter 503, a word register 504, a code-word decision-information detector 505, a state calculator 506, an address generator 507, a main-information decoder 508, and an auxiliary-information decoder 560. The NRZI demodulator 501 receives the input bit stream representing a succession of input code words. The NRZI demodulator 501 is connected with the sync detector 502, the S/P converter 503, and the auxiliary-information decoder 560. The sync detector 502 is connected with the S/P converter 503. The S/P converter 503 is connected with the word register 504 and the state calculator 506. The word register 504 is connected with the code-word decision-information detector 505, the state calculator 506, and the address generator 507. The code-word decision-information detector 505 is connected with the state calculator 506. The state calculator 506 is connected with the address generator 507. The address generator 507 is connected with the main-information decoder 508.

The NRZI demodulator 501 subjects the input bit stream to NRZI demodulation (NRZI conversion). The NRZI demodulator 501 outputs the NRZI-demodulation-resultant signal (the NRZI-demodulation-resultant bit stream) to the sync detector 502, the S/P converter 503, and the auxiliary-information decoder 560.

The sync detector 502 detects every sync word in the NRZI-demodulation-resultant signal. The sync detector 502 generates a word clock signal in response to the detected sync words. The sync detector 502 feeds the generated word clock signal to the S/P converter 503. The S/P converter 503 subjects the NRZI-demodulation-resultant bit stream to serial-to-parallel conversion in response to the word clock signal, thereby periodically generating a 6-bit parallel-form signal segment handled as an input code word C(k). Thus, the S/P converter 503 changes the NRZI-demodulation-resultant bit stream into a sequence of input code words. The S/P converter 503 outputs the input code word C(k) to the word register 504 and the state calculator 506. The input code word C(k) is written into the word register 504. The input code word C(k) is temporarily stored in the word register 504 before being outputted therefrom as a delayed input code word C(k−1). Specifically, the word register 504 delays the input code word C(k) by a time interval corresponding to one word. The delayed input code word C(k−1) is fed from the word register 504 to the code-word decision-information detector 505, the state calculator 506, and the address generator 507.

The code-word decision-information detector 505 detects a code-word-related decision information in response to the delayed input code word C(k−1). The code-word decision-information detector 505 informs the state calculator 506 of the detected decision information. The state calculator 506 computes an encoding state S(k) from the input code word C(k), the detected decision-information, and the delayed input code word C(k−1). The computed encoding state S(k) corresponds to the sub encoding table used in generating the input code word C(k). In other words, the computed encoding state S(k) is equal to the next-table selection number S(k+1) accompanying the delayed input code word C(k−1) and used in an encoder side (a modulation side). Thus, the next-table selection number S(k+1) accompanying the delayed input code word C(k−1) is recovered. The state calculator 506 informs the address generator 507 of the encoding state S(k), that is, the next-table selection number S(k+1) accompanying the delayed input code word C(k−1). The address generator 507 produces an address signal in response to the delayed input code word C(k−1) and the encoding state S(k). The address generator 507 outputs the produced address signal to the main-information decoder 508. The main-information decoder 508 contains a decoding table having an array of 4-bit output code words at different addresses. The decoding table is accessed in response to the address signal. One output code word D(k−1) at an address corresponding to the address signal is selected from the output code words in the decoding table. The main-information decoder 508 feeds the selected output code word D(k−1) to an external as a reproduced original code word D(k−1).

Specifically, the decoding table includes an array of cells each having a set of an input code word C(k−1), an output code word D(k−1), and an encoding state S(k). As previously indicated, the encoding state S(k) corresponds to a next-table selection number S(k+1) accompanying the input code word C(k−1). An output code word D(k−1) can be decided in response to a set of an input code word C(k−1) and an encoding state S(k) by referring to the decoding table. An example of the contents of the decoding table is shown in FIG. 15.

Input code words can be grouped into three cases "0", "1", and "2" according to LSB-side zero run length. The cases "0", "1", and "2" are given to decision information of "0", "1", and "2", respectively. Specifically, input code words each having an LSB-side zero run length of "0" are assigned to the case "0", that is, decision information of "0". Input code words each having an LSB-side zero run length of "1", "2", or "3" are assigned to the case "1", that is, decision information of "1". Input code words having LSB-side zero run lengths of "4", "5", or "6" are assigned to the case "2", that is, decision information of "2". Each of the input code words in the case "0" (corresponding to decision information of "0") is always followed by an input code word which results from an encoding procedure using the sub encoding table denoted by an ID number of "0" or "1". Each of the input code words in the case "1" (corresponding to decision information of "1") is always followed by an input code word which results from an encoding procedure using the sub encoding table denoted by an ID number of "1", "2", or "3". Each of the input code words in the case "2" (corresponding to decision information of "2") is always followed by an input code word which results from an encoding procedure using the sub encoding table denoted by an ID number of "2" or "3".

The code-word decision-information detector 505 contains a table representative of the previously-mentioned assignment of the input code words to the cases "0", "1", and "2" (decision information of "0", "1", and "2") which depends on LSB-side zero run length. The code-word decision-information detector 505 detects the LSB- side zero run length of the delayed input code word C(k−1). The code-word decision-information detector 505 accesses the assignment table in response to the detected zero run length, and thereby detects the decision information to which the delayed input code word C(k−1) is assigned. The code-word decision-information detector 505 informs the state calculator 506 of the detected decision information. The state calculator 506 computes an encoding state S(k) from the input code word C(k), the delayed input code word C(k−1), and the detected decision information according to a predetermined algorithm. The computed encoding state S(k) corresponds to the sub encoding table used in generating the input code word C(k). In other words, the computed encoding state S(k) is equal to the next-table selection number S(k+1) accompanying the delayed input code word C(k−1) and used in an encoder side. The state calculator 506 notifies the encoding state S(k), that is, the next-table selection number S(k+1) accompanying the delayed input code word C(k−1), to the address generator 507. The address generator 507 produces an address signal in response to the delayed input code word C(k−1) and the encoding state S(k). The address generator 507 outputs the produced address signal to the main-information decoder 508. The main-information decoder 508 accesses the decoding table in response to the address signal. An output code word D(k−1) corresponding to the address signal, that is, an output code word D(k−1) corresponding to a set of the delayed input code word C(k−1) and the encoding state S(k), is read out from the decoding table. The main-information decoder 508 feeds the read-out output code word D(k−1) to an external as a reproduced original code word D(k−1).

An example of the predetermined algorithm used by the state calculator 506 is as follows.

Algorithm in C-Language-Based Version if (decision information == 0 [
  if (C(k) is in sub encoding table having ID= 0)
    S(k)=0;
  elseif (C(k) is in sub encoding table having ID= 1)
    S(k)=1;]
if (decision information== 1 [
  if (C(k) is in sub encoding table having ID= 1)
    S(k)=1;
  elseif (C(k) is in sub encoding table having ID= 2)
    S(k)=2;
  elseif (C(k) is in sub encoding table having ID=3∥1)
    S(k)=3;
  elseif (C(k)==0 && C(k−1)==32)
    S(k)=3;
  elseif (C(k)==0 && C(k−1)==42)
    S(k)=2;]
if (decision information==2 [
  if (C(k) is in sub encoding table having ID=3∥9∥5∥2)
    S(k)=3;
  elseif (C(k) is in sub encoding table having ID=2∥4∥10∥8)
    S(k)=2;
  elseif (C(k)==21)
    S(k)=0;]

In the above algorithm: "==" denotes "equal to"; "&&" denotes "and"; and "∥" denotes "or".

Figures 16, 17:
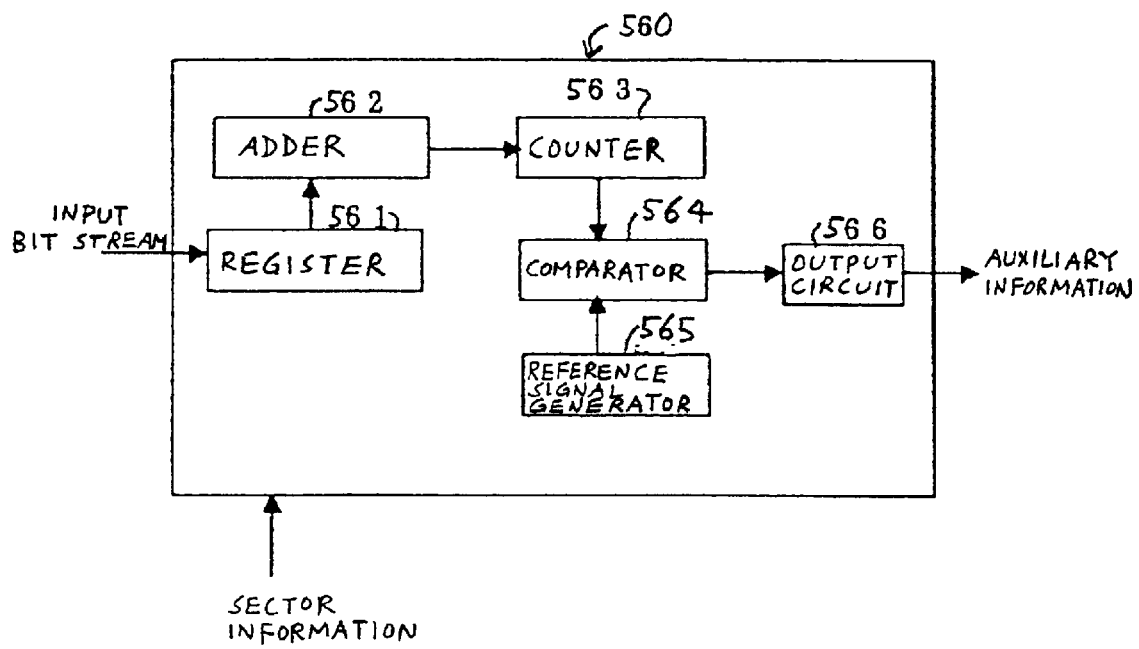
FIG. 16 is a diagram of a succession of input code words C(k) being "010000", "001001", "000001", "000101", and "010001", a succession of reproduced original code words D(k) corresponding to the input code words C(k), a succession of states of decision information corresponding to the input code words C(k), and a succession of encoding states S(k) corresponding to the input code words C(k).
FIG. 17 is a block diagram of an auxiliary-information decoder in FIG. 14.

FIG. 16 shows a succession of input code words of "010000", "001001", "000001", "000101", and "010001". In the case where the input code word C(k−1) of interest is "010000" and the immediately-following input code word C(k) is "001001", since the LSB-side zero run length of the input code word C(k−1) is "4", the decision information corresponding to the input code word C(k−1) is found to be "2" by referring to the previously-mentioned assignment table. The encoding state S(k), that is, the next-table selection number S(k+1) accompanying the input code word C(k−1), is found to be "3" according to the predetermined algorithm using the input code word C(k), the decision information of "2", and the input code word C(k−1). The input code word C(k−1) of interest is decoded into an output code word D(k−1) of "15" in decimal by referring to the decoding table (see FIG. 15) in response to the encoding state S(k) being "3".

In the case where the input code word C(k−1) of interest is "001001" and the immediately-following input code word C(k) is "000001", since the LSB-side zero run length of the input code word C(k−1) is "0", the decision information corresponding to the input code word C(k−1) is found to be "0" by referring to the previously-mentioned assignment table. The encoding state S(k), that is, the next-table selection number S(k+1) accompanying the input code word C(k−1), is found to be "0" according to the predetermined algorithm using the input code word C(k), the decision information of "0", and the input code word C(k−1). The input code word C(k−1) of interest is decoded into an output code word D(k−1) of "0" in decimal by referring to the decoding table (see FIG. 15) in response to the encoding state S(k) being "0".

In the case where the input code word C(k−1) of interest is "000001" and the immediately-following input code word C(k) is "000101", since the LSB-side zero run length of the input code word C(k−1) is "0", the decision information corresponding to the input code word C(k−1) is found to be "0" by referring to the previously-mentioned assignment table. The encoding state S(k), that is, the next-table selection number S(k+1) accompanying the input code word C(k−1), is found to be "1" according to the predetermined algorithm using the input code word C(k), the decision information of "0", and the input code word C(k−1). The input code word C(k−1) of interest is decoded into an output code word D(k−1) of "1" in decimal by referring to the decoding table (see FIG. 15) in response to the encoding sate S(k) being "1".

In the case where the input code word C(k−1) of interest is "000101" and the immediately-following input code word C(k) is "010001", since the LSB-side zero run length of the input code word C(k−1) is "0", the decision information corresponding to the input code word C(k−1) is found to be "0" by referring to the previously-mentioned assignment table. The encoding state S(k), that is, the next-table selection number S(k+1) accompanying the input code word C(k−1), is found to be "0" according to the predetermined algorithm using the input code word C(k), the decision information of "0", and the input code word C(k−1). The input code word C(k−1) of interest is decoded into an output code word D(k−1) of "2" in decimal by referring to the decoding table (see FIG. 15) in response to the encoding state S(k) being "0".

In FIG. 16, the input code word C(k−1) being "001001" is generated by an encoder side (a modulation side) through the code-word selection procedure for the DSV control. Specifically, in the encoder side, a first candidate modulation-resultant code word being "101001" and assigned to an original code word of "0" (decimal) is read out from the sub encoding table (see FIG. 3) having an ID number of "3" while a second candidate modulation-resultant code word being "001001" and assigned to the original code word is read out from the sub encoding table having an ID number of "1". The encoder side selects the second candidate modulation-resultant code word. Thus, the encoder side uses "001001" instead of "101001". Although the code-word selection and change is implemented by the encoder side in this way, the demodulation apparatus 500 correctly decodes the input code word C(k−1) being "001001" into an original code word D(k−1) of "0" as previously mentioned. Furthermore, the reproduction of original code words (the main information) from the input bit stream by the demodulation apparatus 500 is accurate regardless of whether the run length limiting rules used by the encoder side are (1, 7)RLL or (1, 8)RLL.

With reference back to FIG. 14, the auxiliary-information decoder 560 receives the bit stream from the NRZI demodulator 501. In addition, the auxiliary-information decoder 560 receives sector information from a suitable device (not shown). The sector information indicates the boundaries between recording blocks (recording sectors) with respect to the output signal of the NRZI demodulator 501. The sector information can be generated by a sync detector (for example, the sync detector 502) for sensing a specified bit pattern in the bit stream outputted from the NRZI demodulator 501. The sector information can also be generated by a signal processor following the main-information decoder 508.

As shown in FIG. 17, the auxiliary-information decoder 560 includes a register 561, an adder 562, a counter 563, a comparator 564, a reference signal generator 565, and an output circuit 566. The register 561 is connected with the NRZI demodulator 501. In addition, the register 561 is connected with the adder 562. The adder 562 is connected with the counter 563. The counter 563 is connected with the comparator 564. The comparator 564 is connected with the reference signal generator 565, and the output circuit 566.

The auxiliary-information decoder 560 is designed in view of the following facts. The run length limiting rules "(1, 8)RLL" cause a succession of 8 bits of "0" in a modulation-resultant bit stream. On the other hand, the run length limiting rules "(1, 7)RLL" cause the absence of a succession of 8 bits of "0" from a modulation-resultant bit stream. Auxiliary information (a maximum-run-length setting signal) of "1" is assigned to (1, 8)RLL while auxiliary information of "0" is assigned to (1, 7)RLL.

The register 561 is of a shift type with 8 bits. The bit stream from the NRZI demodulator 501 is propagated through the register 561. The adder 562 accesses 1-bit-corresponding storage segments in the register 561, thereby detecting every succession of 8 bits of "0" in the bit stream from the NRZI demodulator 501. The adder 562 outputs a signal representative of the detection result to the counter 563. The device 563 counts successions each of 8 bits of "0" in response to the output signal from the adder 562 during every 1-sector-corresponding time interval determined by the sector information. In other words, the counter 563 detects the frequency of the occurrence of a succession of 8 bits of "0". The counter 563 outputs a signal representative of the count-result number to the comparator 564. The reference signal generator 565 outputs a signal representative of a predetermined reference number to the comparator 564. The device 564 compares the count-result number with the reference number. When the count-result number is greater than the reference number, the comparator 564 feeds a signal of "1" to the output circuit 566 as a recovered maximum-run-length setting signal (recovered auxiliary information). Otherwise, the comparator 564 feeds a signal of "0" to the output circuit 566 as a recovered maximum-run-length setting signal (recovered auxiliary information). The counter 563 is periodically reset in response to the sector information. The output circuit 566 transmits the recovered auxiliary information, that is, a signal of "1" or "0", to a later stage at every timing determined by the sector information. The reference number represented by the output signal from the reference signal generator 565 is chosen to reliably prevent the occurrence of an error in the recovered auxiliary information.

Third Embodiment

An auxiliary-information application system of a third embodiment of this invention includes the modulation apparatus 1 of FIG. 4 and the demodulation apparatus 500 of FIG. 14.

In the case where a digital information signal can be recorded on the recording medium 2 (see FIG. 4) at a data rate of 50 Mbps and every recording sector of the digital information signal has 2048 bytes, the auxiliary information can be recorded on the recording medium 2 at a data rate of about 3 kbps. For example, the auxiliary information includes picture encoding information which conforms with the H. 261 standards, the H. 263 standards, or the MPEG4 standards. Alternatively, the auxiliary information may include audio encoding information which conforms with the H. 723 standards or the AAC standards. The auxiliary information may include information which results from run length encoding or quantization of auxiliary-picture character information represented by bit map data in, for example, DVDs. The auxiliary information may include closed caption information such as character code information used in digital broadcasting, for example, ATSC. The auxiliary information may include information representative of a URL address related to contents information.

The auxiliary information may include address information representative of the name of a source in which each of prescribed portions of contents information is written. In these cases, information provided by accessing an Internet address or a file name can be indicated when contents information is displayed. Preferably, the address information is of a prescribed format structure in which about 8 bits indicating the number of used characters are followed by the characters representing an address such as a URL-name-indicating address.

Figure 18:
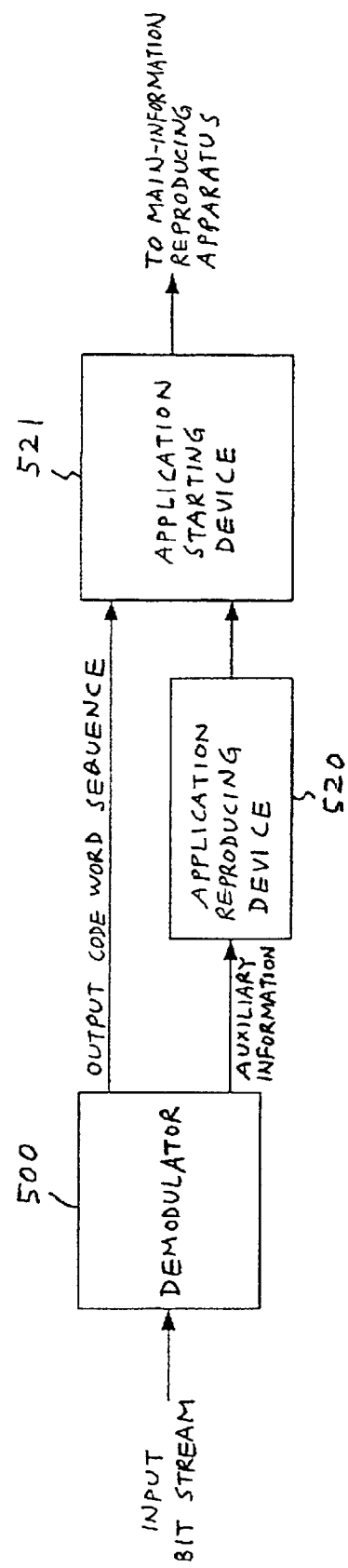
FIG. 18 is a block diagram of an auxiliary-information application system according to a third embodiment of this invention.

As shown in FIG. 18, the auxiliary-information application system includes the demodulation apparatus 500, an application reproducing device 520, and an application starting device 521. The demodulation apparatus 500 recovers main information and auxiliary information from an input bit stream or a sequence of code words generated by, for example, the modulation apparatus 1 in FIG. 4. The demodulation apparatus 500 outputs the recovered main information to the application starting device 521. The demodulation apparatus 500 outputs the recovered auxiliary information to the application reproducing device 520. The application reproducing device 520 reproduces application-related information from the auxiliary information. The application reproducing device 520 outputs the reproduced application-related information to the application starting device 521. In response to the application-related information, the application starting device 521 starts an application procedure of processing the main information. The application starting device 521 outputs application-procedure-resultant information to an external such as a main-information player or a main-information reproducing apparatus.

Examples of the application procedure are as follows.
(1) The main information contains encryption-resultant information. A key is generated from the auxiliary information. The encryption-resultant information is decrypted in response to the generated key.
(2) The auxiliary information is superimposed on or mixed with the main information. Alternatively, specified data in the main information are changed in response to the auxiliary information.
(3) The auxiliary information is used in deciding conditions related to the recording or the reproduction of the main information.
(4) The auxiliary information contains ID (identification) information representing a management number of the main information or a copyright thereon. The main information is protected and managed by referring to the ID information.

It should be noted that the auxiliary information may be independent of the main information. The auxiliary information can be detected before the contents of the main information are recovered.

Fourth Embodiment

Figure 19:
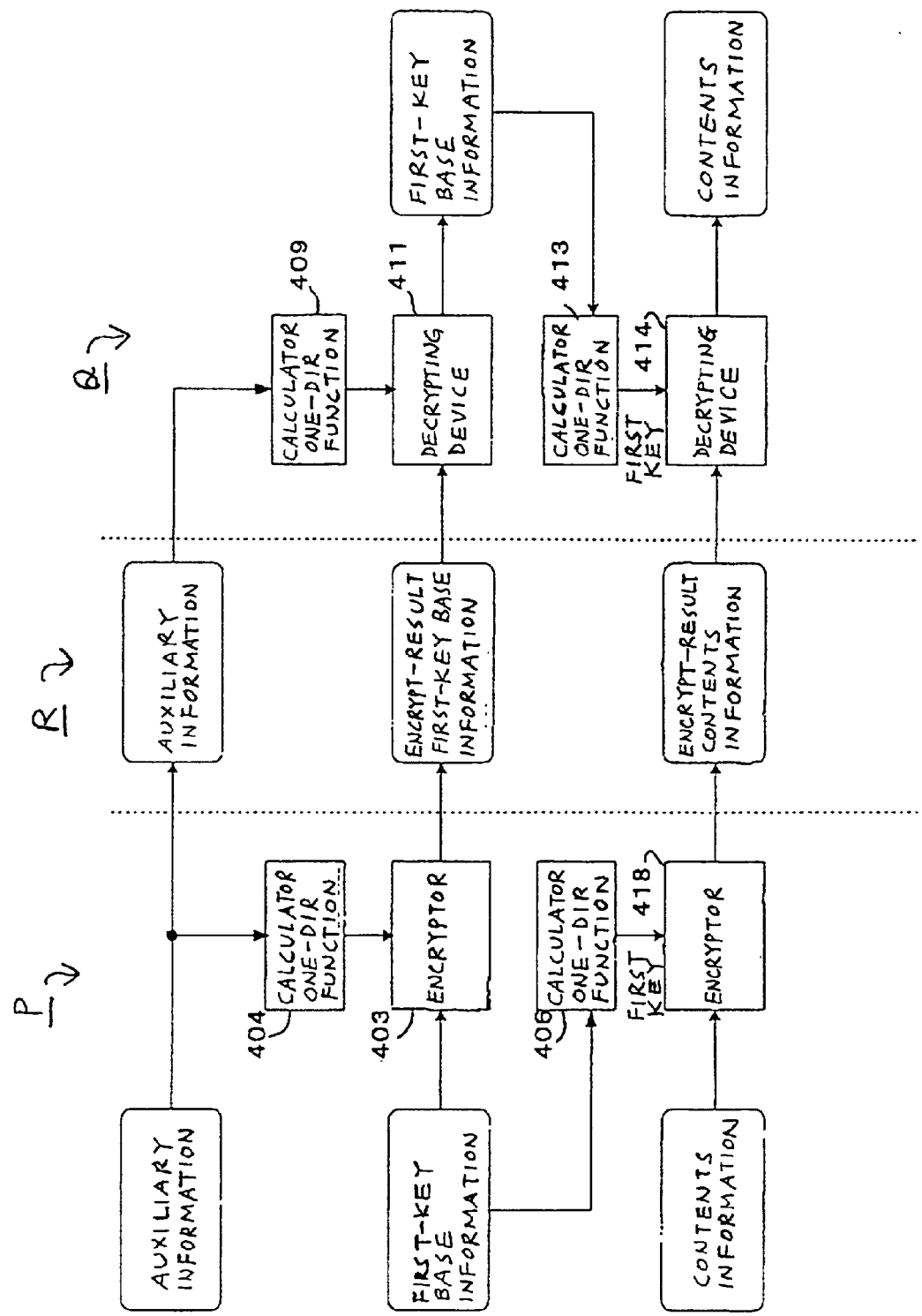
FIG. 19 is a block diagram of an information processing system according to a fourth embodiment of this invention.

FIG. 19 shows an information processing system according to a fourth embodiment of this invention. The information processing system of FIG. 19 is based on the modulation apparatus 1 of FIG. 4, the demodulation apparatus 500 of FIG. 14, and the auxiliary-information application system of FIG. 18. The information processing system of FIG. 19 handles contents information (main information) and auxiliary information.

With reference to FIG. 19, the information processing system includes a primary section P, a secondary section Q, and an intermediate section R. The primary section P and the secondary section Q are connected to each other via the intermediate section R.

The primary section P includes an information recording apparatus or an information transmitting apparatus. The secondary section Q includes an information reproducing apparatus or an information receiving apparatus. An example of the information reproducing apparatus is an information player. The intermediate section R includes a recording medium or a transmission medium. Examples of the recording medium are a magnetic recording medium, an optical recording medium, and a semiconductor memory. Examples of the transmission medium are an optical fiber cable, electric wires, and a radio transmission line. The transmission medium is also referred to as a transmission line.

In the primary section P, auxiliary information being a base of a second key is fed from a suitable device (not shown). The primary section P outputs the auxiliary information to the intermediate section R. Specifically, the primary section P records the auxiliary information on the recording medium of the intermediate section R, or transmits the auxiliary information to the transmission line of the intermediate section R.

The primary section P includes a calculator 404 which receives the auxiliary information being the base of the second key. The calculator 404 generates a signal (data) representative of the second key from the auxiliary information according to a predetermined one-directional function. The calculator 404 outputs the second-key signal (the second-key data) to an encryptor 403.

The one-directional function is a one-directional hash function. The one-directional function means a function "h" designed to meet conditions as follows. When a certain value "x" is given in a domain of definition, it is difficult to calculate a value "y" which satisfies the relation as "h(x)= h(y)".

The encryptor 403 receives information being a base of a first key different from the second key. The first-key base information is fed from a suitable device (not shown). The device 403 encrypts the first-key base information into encryption-resultant first-key base information in response to the second-key signal. The encryptor 403 outputs the encryption-resultant first-key base information to the intermediate section R.

Specifically, the primary section P records the encryption-resultant first-key base information on the recording medium of the intermediate section R, or transmits the encryption-resultant first-key base information to the transmission line of the intermediate section R.

The encryptor 403 may encrypt a part of the first-key base information in response to the second-key signal. For example, the device 403 encrypts only an important portion of the first-key base information. Alternatively, the device 403 may encrypt the whole of the first-key base information.

The primary section P includes a calculator 406 which receives the first-key base information. The calculator 406 generates a signal (data) representative of the first key from the first-key base information according to a predetermined one-directional function. Preferably, the one-directional function used by the calculator 406 differs from that used by the calculator 404. The one-directional function used by the calculator 406 may be the same as that used by the calculator 404. The calculator 406 outputs the first-key signal (the first-key data) to an encryptor 418.

The encryptor 418 receives contents information, that is, main information, from a suitable device (not shown). The device 418 encrypts the received contents information into encryption-resultant contents information in response to the first-key signal. The encryptor 418 outputs the encryption-resultant contents information to the intermediate section R.

Specifically, the primary section P records the encryption-resultant contents information on the recording medium of the intermediate section R, or transmits the encryption-resultant contents information to the transmission line of the intermediate section R.

The encryptor 418 may additionally include a compressor. In this case, the encryptor 418 compresses the contents information, and then encrypts the compression-resultant contents information. The compression of the contents information is executed in a predetermined compressing method such as an MPEG (Moving Picture Experts Group) compressing method. The encryption of the compression-resultant contents information is executed in an encrypting method such as DES (Data Encryption Standard).

According to DES, contents information is encrypted and decrypted 64 bits by 64 bits in response to a common key represented by a 56-bit signal.

It should be noted that compression-resultant contents information may be fed to the encryptor 418 from an external device (not shown). In this case, the compressor is omitted from the encryptor 418.

The encryption by the encryptor 418 includes a step of dividing every 64-bit block of the contents information (or the compression-resultant contents information) into a pair of 32-bit sub blocks. The encryption includes additional steps for signal processing on a sub-block by sub-block basis. The additional steps contain a step of transposing data, a step of executing permutation of data, a step of processing data according to a nonlinear function, and a step of executing Exclusive-OR operation between data.

In the case of DES, an encrypting key is represented by data having 56 bits. Accordingly, specified 56-bit information peculiar to the primary section P (or the system) is set as first-key base information, that is, information being a base of a first key corresponding to a one-directional function having an output bit number of 56.

In the case where the contents of the one-directional function are open to the public and the first-key base information is required to be recorded on the recording medium of the intermediate section R or be outputted to the transmission line of the intermediate section R, it is preferable that the first-key base information is encrypted before being recorded on the recording medium or being outputted to the transmission line.

As previously mentioned, the auxiliary information is the second-key base information. Preferably, the second-key base information differs from the first-key base information. In this case, specified 56-bit information peculiar to the primary section P (or the system) which differs from the specified 56-bit information for the first key is set as the second-key base information. The calculator 404 uses the auxiliary information (the second-key base information) in generating the second-key signal according to the predetermined one-directional function. Thus, the auxiliary information corresponds to a one-directional function having an output bit number of 56. In the case where the contents of the one-directional function are open to the public and the auxiliary information (the second-key base information) is required to be recorded on the recording medium of the intermediate section R or be outputted to the transmission line of the intermediate section R, it is preferable that the auxiliary information is concealed before being recorded on the recording medium or being outputted to the transmission line. The primary section P includes the modulation apparatus 1 (see FIG. 4) which superimposes the auxiliary information on the main information, that is, the contents information. It is difficult for a demodulation side to reproduce the auxiliary information without using the demodulation apparatus 500 (see FIG. 14).

As shown in FIG. 20, there is a calculator 450 for generating the auxiliary information from a basic information piece or pieces. The basic information pieces include, for example, 1) an information piece about a region or regions corresponding to one or more countries, one or more zones, or one or more spaces, 2) an information piece about identification (ID) of an individual, 3) an information piece about identification of a group of persons, 4) an information piece about a rating, 5) an information piece about identification of an apparatus maker or a device maker, 6) an information piece about identification of a contents provider, 7) an information piece about time (a playback allowable term), 8) an information piece about contents authors, 9) an information piece about identification of a reproducing apparatus or a reproducing device (a player), 10) an information piece about identification of a connection apparatus or a connection device, 11) an information piece about identification of a medium on which contents information is recorded, 12) an information piece about identification of contents information, and 13) an information piece about accounting. The calculator 450 executes Exclusive-OR operation among the information pieces 1) to 13), thereby generating the auxiliary information.

Preferably, the modulation apparatus 1 (see FIG. 4) in the primary section P receives the encryption-resultant contents information as main information. The modulation apparatus 1 (see FIG. 4) superimposes the auxiliary information on the main information before the main information is outputted to the intermediate section R.

The encryption-resultant contents information, the encryption-resultant first-key base information, and the auxiliary information (the second-key base information) are transmitted from the primary section P to the secondary section g through the intermediate section R.

The secondary section Q includes the demodulation apparatus 500 (see FIG. 14) which separates the main information and the auxiliary information from each other. With reference back to FIG. 19, the secondary section Q includes a calculator 409 which receives the auxiliary information (the second-key base information) from the intermediate section R via the demodulation apparatus 500. The calculator 409 generates a signal (data) representative of the second key from the second-key base information according to a predetermined one-directional function equal to that used by the calculator 404 in the primary section P. The calculator 409 outputs the second-key signal (the second-key data) to a decrypting device 411.

The decrypting device 411 receives the encryption-resultant first-key base information from the intermediate section R. The decrypting device 411 decrypts the encryption-resultant first-key base information into the first-key base information in response to the second-key signal. The decrypting device 411 outputs the first-key base information to a calculator 413.

The calculator 413 generates a signal (data) representative of the first key from the first-key base information according to a predetermined one-directional function equal to that used by the calculator 406 in the primary section P. The calculator 413 outputs the first-key signal (the first-key data) to a decrypting device 414.

The decrypting device 414 receives the encryption-resultant contents information from the intermediate section R via the demodulation apparatus 500 (see FIG. 14). The decrypting device 414 decrypts the encryption-resultant contents information into the original contents information in response to the first-key signal. Thus, the decrypting device 414 reproduces the original contents information. The decrypting device 414 outputs the reproduced contents information.

It should be noted that the auxiliary information may be a simple set of the previously-mentioned information pieces 1) to 13). The auxiliary information may be recorded on a lead-in portion or another portion of a recording medium on a superimposition basis. The auxiliary information may be recorded on recording-medium sectors loaded with head portions of contents programs.

The region information piece, that is, the information piece 1), in the auxiliary information concerns a region or regions corresponding to one or more countries, one or more zones, or one or more spaces. Preferably, the region information piece represents designated one or ones of regions. Examples of regions are as follows. According to a first example, the word is divided into three regions using an NTSC television system, a PAL television system, and a SECAM television system respectively. According to a second example, the world is divided into six regions. According to a third example, the word is divided into regions corresponding to the respective countries. Each country-corresponding region may be divided into smaller regions corresponding to respective districts. In view of playback or reproduction of contents information within airplanes, spaces in the airplanes may be set as regions.

The individual ID information piece, that is, the information piece 2), in the auxiliary information represents, for example, a secret number known by only a related individual. According to a second example, the individual ID information piece represents an ID number preassigned to a related individual. According to a third example, the individual ID information piece represents a secret number or a registered number of a credit card. According to a fourth example, the individual ID information piece represents an information number generated on the basis of a physical character of a related individual. The physical character means a fingerprint, an iris pattern, or a DNA.

The group ID information piece, that is, the information piece 3), in the auxiliary information represents, for example, an ID number of a related family. According to a second example, the group ID information piece represents an ID number of a related party. According to a third example, the group ID information piece represents an ID number of a related club or a related team. According to a fourth example, the group ID information piece represents an ID number of a group of residents in a building such as a condominium or an apartment house.

The rating information piece, that is, the information piece 4), in the auxiliary information represents, for example, a number indicative of a level of violence scenes or sexual scenes. According to a second example, the rating information piece represents a number indicative of a level of a right to watch violence scenes or sexual scenes. According to a third example, the rating information piece represents a number calculated from the age of a person who will play back contents information.

Different ID code words are preassigned to apparatus makers (device makers), respectively. The apparatus maker ID information piece, that is, the information piece 5), in the auxiliary information represents an ID code word of a related apparatus maker. Each apparatus maker's name may be translated into an ASCII code word. In this case, 56 higher bits of the ASCII code word are used as the apparatus maker ID information piece.

Different ID code words are preassigned to movie makers for providing contents information, respectively. The contents provider ID information piece, that is, the information piece 6), in the auxiliary information represents an ID code word of a related movie maker. Each movie maker's name may be translated into an ASCII code word. In this case, 56 higher bits of the ASCII code word are used as the contents provider ID information piece.

The time information piece, that is, the information piece 7), in the auxiliary information piece represents, for example, a playback allowable time limit or a recording date. Year, month, day, and time may be converted into numerals. In this case, the time information piece is generated by assigning "0" to numerals less than a reference value, and assigning "1" to numerals equal to or greater than the reference value.

The contents author information piece, that is, the information piece 8), in the auxiliary information represents, for example, an ID number of a person who records and edits contents information. The contents author information piece represents ID numbers of persons who edit and process contents information, or an ID number of a company which edits and processes contents information in the case of making a package of previously-recorded contents information.

Serial numbers are given to players (reproducing apparatuses or reproducing devices), respectively. The reproducing apparatus ID information piece, that is, the information piece 9), in the auxiliary information represents, for example, a serial number of a related player.

The connection apparatus ID information piece, that is, the information piece 10), in the auxiliary information represents, for example, a number selected from among a serial number and a type-related number of a communication-opposite-party apparatus which is connected with the present apparatus when mutual authentication is executed therebetween.

Different ID code words are previously recorded on media, respectively. The ID code words may represent ID numbers peculiar to the media, respectively. Alteratively, the ID code words may represent serial numbers assigned to the media, respectively. The medium ID information piece, that is, the information piece 11), in the auxiliary information represents, for example, an ID code word of a used medium.

Different ID code words are preassigned to contents (for example, movies or music tunes) respectively. The contents ID information piece, that is, the information piece 12), in the auxiliary information represents, for example, an ID code word of one content.

The accounting information piece, that is, the information piece 13), in the auxiliary information represents, for example, an ID number of a program about which accounting is normally executed. According to a second example, the accounting information piece represents an ID number of an individual or a family normally executing accounting. Only in the case where accounting is executed, a specified secrete number may be issued. In this case, data representative of the specified secret number may be used as the accounting information piece.

The auxiliary information may include ID information for identifying a key or a key-base information piece. There may be a plurality of information pieces representative of different keys or a plurality of key-base information pieces. For example, an ID number for identifying an effective key is recorded on each sector as auxiliary information. In this case, the ID number is in the range of 1 to N, where N denotes a predetermined natural number. ID information for identifying an effective key is settled when the readout of information from a related sector has been completed. Accordingly, the recorded ID information is set in a state delayed by one sector.

Fifth Embodiment

A fifth embodiment of this invention is based on the fourth embodiment thereof. In the fifth embodiment of this invention, auxiliary information contains 1) information related to a copyright and 2) information representing whether or not a recording medium storing contents information is legitimate. The auxiliary information includes authentication data. The authentication data represent ASCII characters which mean the name of a copyright holder, the name of a company, and the name of a studio performing an authoring procedure. Alternatively, the authentication data may represent a binary ID code word for identifying the name of a copyright holder, the name of a company, and the name of a studio performing an authoring procedure. The authentication data are composed of, for example, about 32 bits.

Information representing whether or not a recording medium storing contents information is legitimate is generated on the basis of an authentication system using public-key cryptography. Signature information indicates the legitimacy of contents information. For example, the signature information is generated by a general signature system (an RSA signature system or a DSS signature system) which applies a copyright-holder secret key to a message digest made by a hash function.

With reference to FIG. 21, a read-only recording medium 531 stores a bit stream having a sequence of code words. The bit stream is inputted into a legitimate recorder 532 from the read-only recording medium 531. The legitimate recorder 532 includes a demodulator 533 and a modulator 534. The demodulator 533 is similar to the demodulation apparatus 500 (see FIG. 14). The modulator 534 is similar to the modulation apparatus 1 (see FIG. 4). The demodulator 533 recovers main data (main information) and auxiliary information from the input bit stream. The recovered main data are inputted into the modulator 534. The recovered auxiliary information is inputted into the modulator 534. The modulator 534 combines and processes the main data and the auxiliary information into a bit stream having a sequence of code words. The modulator 534 outputs the bit stream which is recorded on a duplicate recording medium 535. As a result, the main data and the auxiliary data are recorded on the duplicate recording medium 535.

The bit stream is inputted into a legitimate reproducing apparatus 536 from the duplicate recording medium 535. The legitimate reproducing apparatus 536 includes a demodulator 537, a legitimacy deciding device 538, and a recording and reproducing device 539. The demodulator 537 is similar to the demodulation apparatus 500 (see FIG. 14). The demodulator 537 recovers the main data and the auxiliary information from the input bit stream. The recovered main data are inputted into the recording and reproducing device 539. The recovered auxiliary information is inputted into the legitimacy deciding device 538. Since the auxiliary information has been recorded by the legitimate recorder 532, the legitimacy deciding device 538 confirms that authentication data in the auxiliary information are correct. When the legitimacy deciding device 538 confirms that authentication data in the auxiliary information are correct, the legitimacy deciding device 538 feeds a playback-permission signal to the recording and reproducing device 539. The recording and reproducing device 539 outputs the main data to a display 540 in response to the playback-permission signal so that the main data are indicated on the display 540. In this way, the main data are played back.

With reference to FIG. 22, a read-only recording medium 531 stores a bit stream having a sequence of code words. The bit stream is inputted into an illegitimate recorder 542 from the read-only recording medium 531. The illegitimate recorder 542 includes a demodulator 543 and a modulator 544. The demodulator 543 recovers only main data (main information) from the input bit stream. The recovered main data are inputted into the modulator 544. The modulator 544 processes the main data into a bit stream having a sequence of code words. The modulator 544 outputs the bit stream which is recorded on a duplicate recording medium 545. As a result, only the main data are recorded on the duplicate recording medium 545.

The bit stream is inputted into a legitimate reproducing apparatus 536 from the duplicate recording medium 545. In the legitimate reproducing apparatus 536, a demodulator 537 recovers only the main data from the input bit stream. The recovered main data are inputted into a recording and reproducing device 539. Correct auxiliary information can not be inputted into a legitimacy deciding device 538. Therefore, the legitimacy deciding device 538 judges that authentication data are wrong. When the legitimacy deciding device 538 judges that authentication data are wrong, the legitimacy deciding device 538 feeds a playback-inhibition signal to the recording and reproducing device 539. The recording and reproducing device 539 is disabled by the playback-inhibition signal so that the main data are inhibited from being played back.

Recording may be controlled in response to a result of a decision about legitimacy. In this case, the auxiliary information may contain information representing a predetermined number of times recording is permitted. The auxiliary information may contain information representing a state such as "copy free", "once copy", or "never copy" in the CGMS. Recording control may be implemented as follows. After authentication has been successful, CGMS-related information (auxiliary information) is detected. In the case where the detected CGMS-related information denotes "copy free", the recording of data on a duplicate recording medium is permitted. In the case where the detected CGMS-related information denotes "once copy", the CGMS-related information is changed to a state of "never copy" and then the recording of data on a duplicate recording medium is permitted. In the case where the detected CGMS-related information denotes "never copy", the recording of data on a duplicate recording medium is inhibited.

Sixth Embodiment

A sixth embodiment of this invention is based on the fourth embodiment thereof. In the sixth embodiment of this invention, auxiliary information contains information related to an address to be accessed. Pieces of electronic data are arranged in an order different from an original playback order on a unit-by-unit basis (for example, a sector-by-sector basis) before being recorded on a recording medium. Each sector is loaded with auxiliary information representing the position of the head of a sector which should follow the sector in the original playback order. During playback, auxiliary information is reproduced, and jumps between sectors are executed in response to the reproduced auxiliary information to provide a sector sequence accorded with the original playback order.

A recording medium stores multiplexed audio information and video information which result from MPEG-based data compression. According to the MPEG-based data compression, a motion compensator generates data representing a decoding-resultant picture. An error between data representing an input picture and the data representing the decoding-resultant picture is calculated. Therefore, temporally-redundant portions of the input-picture data are reduced or deleted. The MPEG-based data compression implements prediction in a direction from the past, prediction in a direction from the future, or prediction in both a direction from the past and a direction from the future. The implemented prediction is changed on an MB-by-MB basis, where MB denotes a macro-block of picture data which corresponds to 16 pixels by 16 pixels. The direction of the implemented prediction is decided by the type of an input picture. Encoding data representative of a P picture is changed between first and second modes. According to the first mode, macro-blocks of the P-picture data are encoded by using the prediction in the direction from the past. According to the second mode, macro-blocks of the P-picture data are independently encoded without using any prediction. Encoding data representative of a B picture is changed among first, second, third, and fourth modes. According to the first mode, macro-blocks of the B-picture data are encoded by using the prediction in the direction from the future. According to the second mode, macro-blocks of the B-picture data are encoded by using the prediction in the direction from the past. According to the third mode, macro-blocks of the B-picture data are encoded by using the prediction in both the direction from the future and the direction from the past. According to the fourth mode, macro-blocks of the B-picture data are independently encoded without using any prediction. Macro-blocks of data representative of an I picture are independently encoded without using any prediction.

Motion compensation implements pattern matching between two successive pictures on an MB-by-MB basis, thereby detecting motion vectors having an accuracy corresponding to a half pel (a half pixel). Shifts of picture segments are executed, and prediction is implemented on the basis of the shift-resultant picture segments. Motion vectors are in a horizontal direction and a vertical direction. There is an MC-mode signal (a motion-compensation-mode signal) indicating the starting position for the prediction. Motion vectors and an MC-mode signal are transmitted as added information related to every macro-block. Successive pictures starting from an I picture to a picture immediately-preceding a next I picture are referred to as a group of pictures (GOP). In general, one GOP is composed of about 15 pictures. Compression-resultant data are divided into unit portions of a common logical structure in which video data representative of one GOP and audio data corresponding to the playback time of the video data are multiplexed with each other. A unit portion of the compression-resultant data is referred to as a cell.

Figure 23:
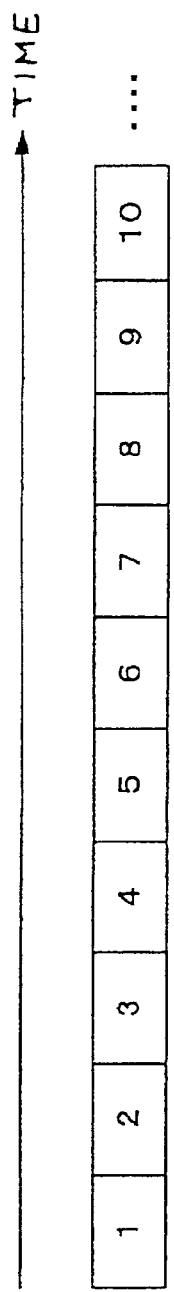
FIG. 23 is a time-domain diagram of a sequence of cells in an original playback order.
Figure 24:
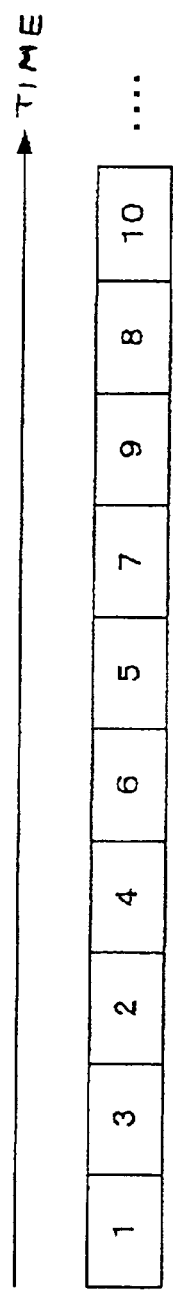
FIG. 24 is a time-domain diagram of a first sequence of cells in an order different from an original playback order.
Figure 25:
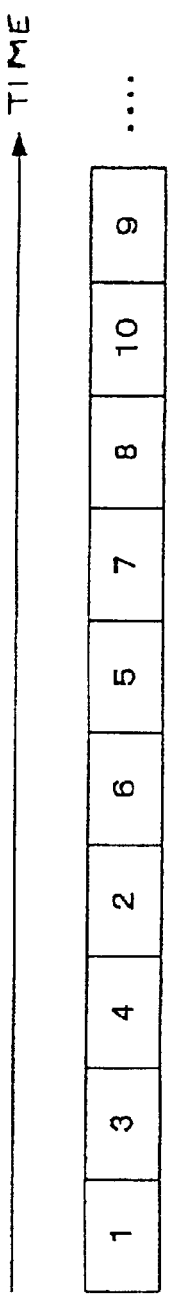
FIG. 25 is a time-domain diagram of a second sequence of cells in an order different from an original playback order.

Cells are reproduced in an original playback order as shown in FIG. 23 so that a program represented by the cells is continuously played back. Cells are rearranged in an order different from the original playback order before being recorded. As a result, the program represented by the cells is scrambled. FIG. 24 shows a first example of the rearranging-resultant order which is caused by jumping some cells to previous positions or later positions. FIG. 25 shows a second example of the rearranging-resultant order which is caused by jumping some cells to previous positions or later positions.

The auxiliary information has a word of a 3-bit code for each cell. Every 3-bit code word indicates the type of a jump by which a related cell can be returned to its correct position in an original playback order. Specifically, an auxiliary-information code word of "000" indicates that a jump is unnecessary. An auxiliary-information code word of "001" indicates a jump over one cell in the forward direction. An auxiliary-information code word of "010" indicates a jump over two cells in the forward direction. An auxiliary-information code word of "011" indicates a jump over three cells in the forward direction. An auxiliary-information code word of "100" indicates a jump over one cell in the backward direction. An auxiliary-information code word of "101" indicates a jump over two cells in the backward direction. An auxiliary-information code word of "110" indicates a jump over three cells in the backward direction. An auxiliary-information code word of "111" indicates a jump over four cells in the backward direction.

In the case where an auxiliary-information code word of "000" is detected during playback, a related cell is inhibited from being jumped. When an auxiliary-information code word of "001" is detected, a related cell is jumped over one cell in the forward direction. When an auxiliary-information code word of "100" is detected, a related cell is jumped over one cell in the backward direction.

A 3-bit code word is recorded as auxiliary information about every cell. A reproducing apparatus detects auxiliary information, and recovers a 3-bit code word therefrom. The reproducing apparatus jumps a related cell in response to the recovered 3-bit code word. As a result, cells are rearranged in the original playback order so that a program represented by the cells can be sequentially played back.

It is assumed that data are recorded on a duplicate recording medium 545 by the illegitimate recorder 542 of FIG. 22. Since the data recorded on the duplicate recording medium 54 lack auxiliary information, the data reproduced from the duplicate recording medium 545 are in an order different from an original playback order. Therefore, in this case, the contents represented by the data are prevented from being correctly played back.

In the case where an illegitimate reproducing apparatus incapable of reproducing auxiliary information reproduces data containing both main information and auxiliary information, the reproduced data are in an order different from an original playback order. Therefore, in this case, the contents represented by the reproduced data are prevented from being correctly played back.

Figure 26:
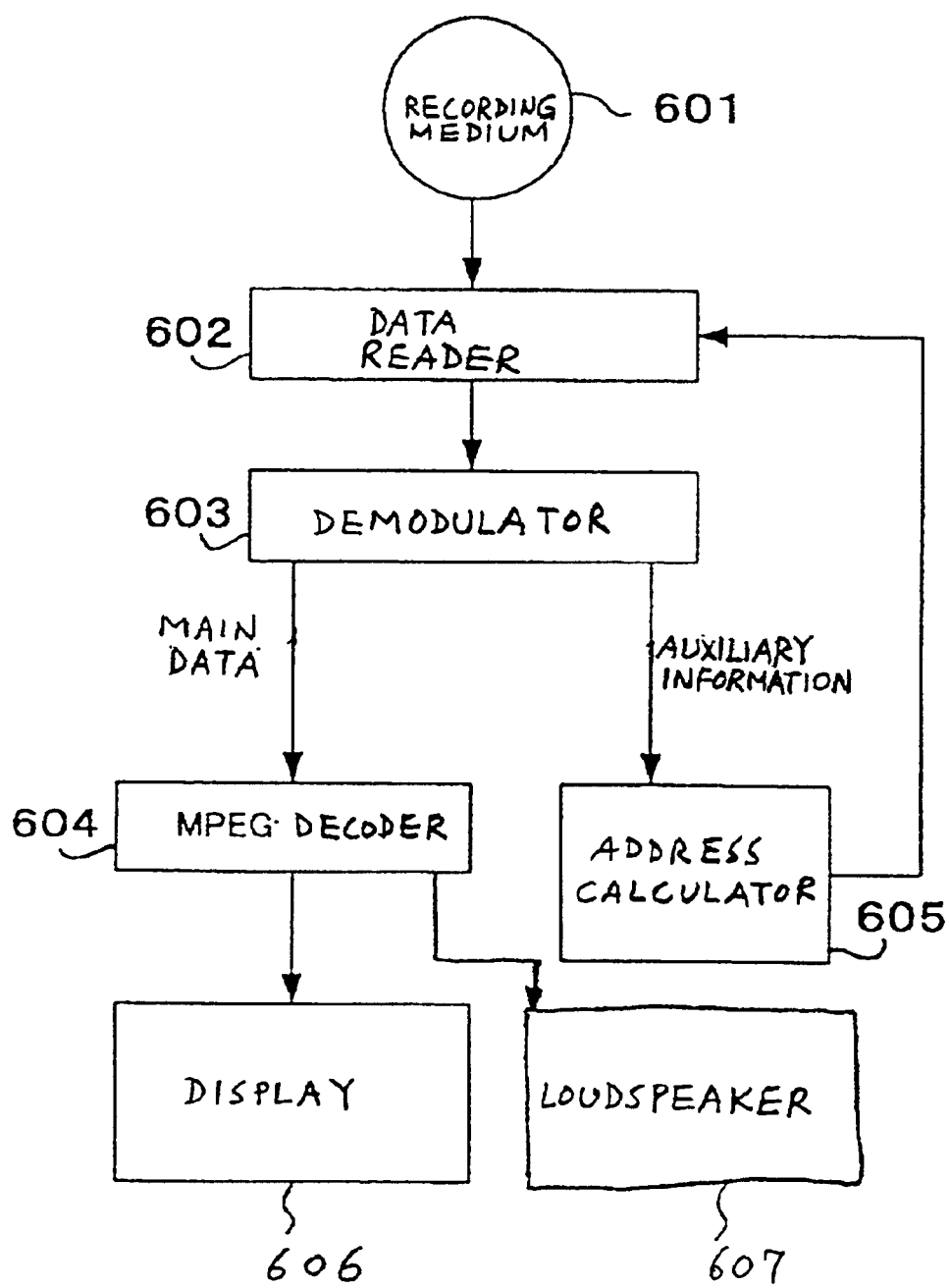
FIG. 26 is a block diagram of an information reproducing apparatus according to a sixth embodiment of this invention.

With reference to FIG. 26, a recording medium 601 stores data in an order different from an original playback order. The stored data contain main data representing a set of audio information and video information placed in cells. The stored data also contain auxiliary information for every cell which indicates the type of a jump by which the related cell can be returned to its correct position in the original playback order. A data reader 602 reads out the data from the recording medium 601 on a cell-by-cell basis. The data reader 602 feeds the read-out data to a demodulator 603. The data reader 602 notifies an address calculator 605 of the currently-accessed point on the recording medium 601. The demodulator 603 is similar to the demodulation apparatus 500 (see FIG. 14). The demodulator 603 reproduces main data and auxiliary information from the read-out data. The demodulator 603 outputs the reproduced main data to an MPEG decoder 604. The demodulator 603 outputs the reproduced auxiliary information to the address calculator 605. The MPEG decoder 604 subjects the main data to an MPEG decoding procedure, thereby reproducing a video signal and an audio signal. The MPEG decoder 604 feeds the reproduced video signal to a display 606. The reproduced video signal is indicated on the display 606. The MPEG decoder 604 feeds the reproduced audio signal to a loudspeaker 607. The reproduced audio signal is converted into corresponding sounds by the loudspeaker 607.

The address calculator 605 derives a 3-bit code word from the auxiliary information. The address calculator 605 computes a jump-destination address from the derived 3-bit code word and the currently-accessed point on the recording medium 601 which is notified by the data reader 602. The jump-designation address denotes the position to which the currently-accessed point on the recording medium 601 should be jumped, that is, the position of the head of a cell to be accessed next. The address calculator 605 notifies the data reader 602 of the computed jump-destination address. When the read-out of the data from the current cell has been completed, the data reader 602 jumps the currently-accessed point on the recording medium 601 to the position denoted by the jump-destination address and then starts reading out the data from a next cell.

Figure 27:
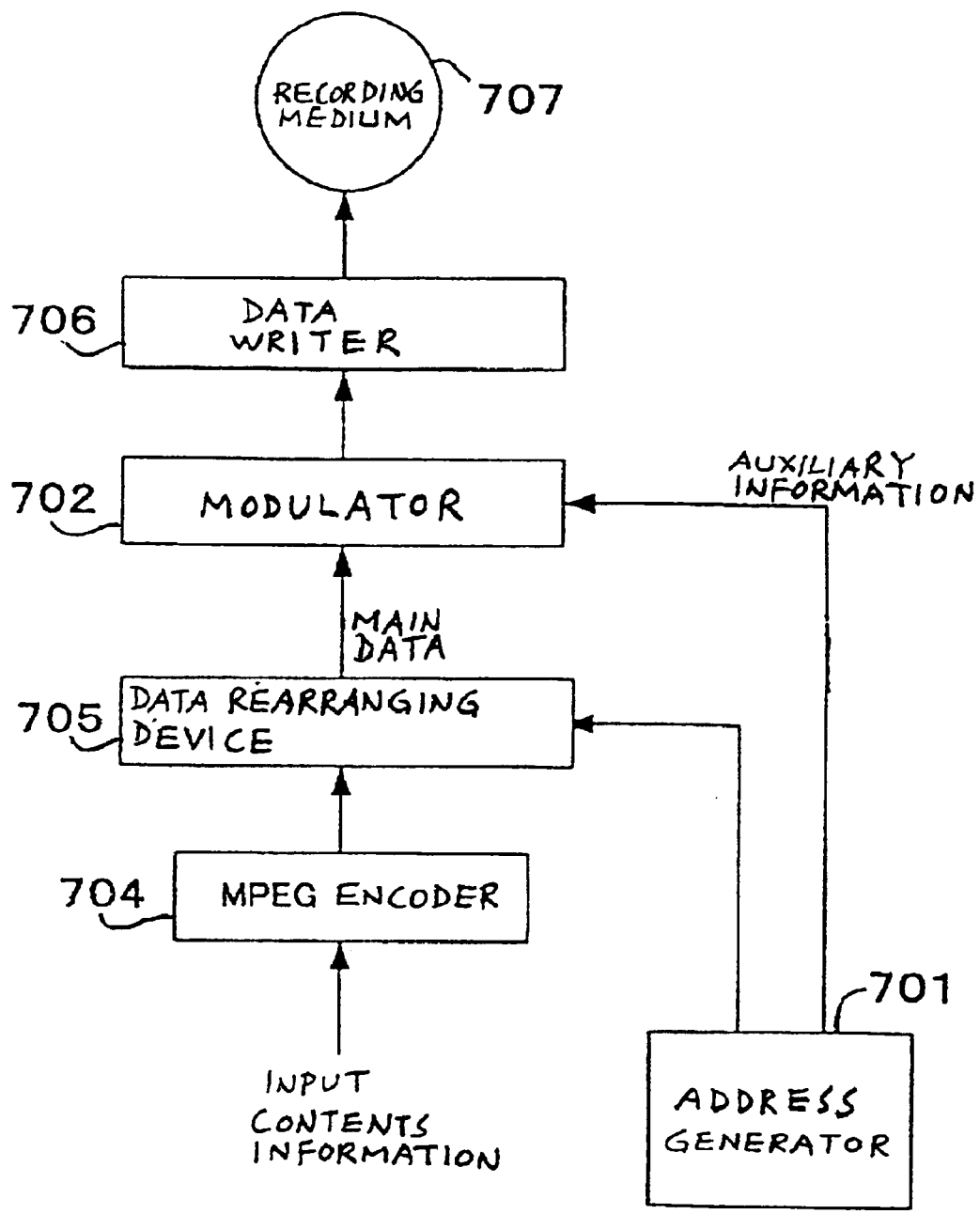
FIG. 27 is a block diagram of an information recording apparatus in the sixth embodiment of this invention.

With reference to FIG. 27, an MPEG encoder 704 compressively encodes input contents data into MPEG contents data. The MPEG encoder 704 outputs a sequence of cells of the MPEG contents data to a data rearranging device 705. An address generator 701 produces a jump-destination address for each cell. According to the produced jump-destination addresses, cells are rearranged in an order different from an original playback order. The address generator 701 converts every jump-designation address into a 3-bit code word, and outputs the 3-bit code word to a modulator 702 as auxiliary information. The address generator 701 notifies the data rearranging device 705 of every jump-destination address. The data rearranging device 705 rearranges the cells of the MPEG contents data in an order being different from the original playback order and being determined by the jump-destination addresses. The date rearranging device 705 outputs the cells of the MPEG contents data to the modulator 702 in the rearranging-resultant order. The modulator 702 is similar to the modulation apparatus 1 (see FIG. 4). The modulator 702 handles the MPEG contents data as main information. The modulator 702 processes the MPEG contents data and the auxiliary information into a composite digital signal having a bit stream. The modulator 702 feeds the composite digital signal to a data writer 706. The data writer 706 writes the composite digital signal on a recording medium 707.

It should be noted that a transmission encoder may receive the composite digital signal from the modulator 702. The transmission encoder changes the composite digital signal into a second digital signal which is of a code suited for transmission via a communication network or a digital broadcasting network. The transmission encoder outputs the second digital signal to a transmission medium formed by a communication network or a digital broadcasting network. In this case, the second digital signal is sent to a user via the communication network or the digital broadcasting network.

What is claimed is:

1. A modulation method comprising the steps of:
   generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;
   sequentially connecting the generated output code words into a sequence which follows run length limiting rules; and
   changing the run length limiting rules between RLL(1, 7) and RLL(1, 8) in response to auxiliary information to superimpose the auxiliary information on the sequence of the generated output code words.

2. A modulation method as recited in claim 1, wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising the steps of generating a first candidate current output code word in response to a current input code word equal to one of the prescribed input code words by referring to the first specified one of the encoding tables, and generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

3. A modulation method as recited in claim 2, further comprising the step of selecting one from the first and second candidate current output code words as a final current output code word.

4. A modulation method as recited in claim 2, further comprising the steps of:
   calculating a first CDS of the first candidate current output code word;
   updating a first DSV of the first candidate current output code word and previous final output code words in response to the first CDS;
   calculating a second CDS of the second candidate current output code word;
   updating a second DSV of the second candidate current output code word and previous final output code words in response to the second CDS;
   determining which of an absolute value of the first DSV and an absolute value of the second DSV is smaller; and
   selecting one from the first and second candidate current output code words which corresponds to the smaller DSV absolute value as a final current output code word.

5. A modulation method as recited in claim 1, further comprising the steps of:
   predicting repetition of a minimum run length at least a predetermined number of times in the sequence of the generated output code words; and
   when the repetition of the minimum run length is predicted, changing an output code word causing the repetition to prevent the repetition of the minimum run length from occurring in the sequence of the generated output code words.

6. A modulation apparatus comprising:
   means for generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;
   means for sequentially connecting the generated output code words into a sequence which follows run length limiting rules; and means for changing the run length limiting rules between RLL(1, 7) and RLL(1, 8) in response to auxiliary information to superimpose the auxiliary information on the sequence of the generated output code words.

7. A modulation apparatus as recited in claim 6, wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising means for generating a first candidate current output code word in response to a current input code word equal to one of the prescribed input code words by referring to the first specified one of the encoding tables, and means for generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

8. A modulation apparatus as recited in claim 7, further comprising means for selecting one from the first and second candidate current output code words as a final current output code word.

9. A modulation apparatus as recited in claim 7, further comprising:
means for calculating a first CDS of the first candidate current output code word;
means for updating a first DSV of the first candidate current output code word and previous final output code words in response to the first CDS;
means for calculating a second CDS of the second candidate current output code word;
means for updating a second DSV of the second candidate current output code word and previous final output code words in response to the second CDS;
means for determining which of an absolute value of the first DSV and an absolute value of the second DSV is smaller; and
means for selecting one from the first and second candidate current output code words which corresponds to the smaller DSV absolute value as a final current output code word.

10. A modulation apparatus as recited in claim 6, further comprising:
means for predicting repetition of a minimum run length at least a predetermined number of times in the sequence of the generated output code words; and
means for, when the repetition of the minimum run length is predicted, changing an output code word causing the repetition to prevent the repetition of the minimum run length from occurring in the sequence of the generated output code words.

11. A demodulation method of demodulating a sequence of 6-bit code words which is generated by the modulation method in claim 1, the demodulation method comprising the steps of:
recovering encoding-table designation information from the code-word sequence, the encoding-table designation information representing which of encoding tables has been used in generating a code word immediately following a code word of interest; and
demodulating the code word of interest into an original code word by referring to a decoding table in response to the recovered encoding-table designation information.

12. A demodulation method as recited in claim 11, further comprising the steps of:
detecting whether the code-word sequence corresponds to (1, 7)RLL or (1, 8)RLL; and
reproducing auxiliary information in response to a result of detecting whether the code-word sequence corresponds to (1, 7)RLL or (1, 8)RLL.

13. A demodulation apparatus for demodulating a sequence of 6-bit code words which is generated by the modulation apparatus in claim 6, the demodulation apparatus comprising:
means for recovering encoding-table designation information from the code-word sequence, the encoding-table designation information representing which of encoding tables has been used in generating a code word immediately following a code word of interest; and
means for demodulating the code word of interest into an original code word by referring to a decoding table in response to the recovered encoding-table designation information.

14. A demodulation apparatus as recited in claim 13, further comprising:
means for detecting whether the code-word sequence corresponds to (1, 7)RLL or (1, 8)RLL; and
means for reproducing auxiliary information in response to a result of detecting whether the code-word sequence corresponds to (1, 7)RLL or (1, 8)RLL.

15. An information recording medium storing a sequence of code words which is generated by the modulation apparatus in claim 6.

16. An information transmission method of transmitting a sequence of code words which is generated by the modulation method in claim 1.

17. An information transmission apparatus for transmitting a sequence of code words which is generated by the modulation apparatus in claim 6.

18. A method of recording auxiliary information, comprising the steps of:
generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;
sequentially connecting the generated output code words into a sequence which follows run length limiting rules; and
changing the run length limiting rules between RLL(1, 7) and RLL(1, 8) in response to auxiliary information to superimpose the auxiliary information on the sequence of the generated output code words;
wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

19. A method as recited in claim 18, wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising the steps of generating a first candidate current output code word in response to a current input code word equal to one of the prescribed input code words by referring to the first specified one of the encoding tables, and generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

20. A method as recited in claim 19, further comprising the step of selecting one from the first and second candidate current output code words as a final current output code word.

21. A method as recited in claim 19, further comprising the steps of:
calculating a first CDS of the first candidate current output code word;
updating a first DSV of the first candidate current output code word and previous final output code words in response to the first CDS;
calculating a second CDS of the second candidate current output code word;
updating a second DSV of the second candidate current output code word and previous final output code words in response to the second CDS;
determining which of an absolute value of the first DSV and an absolute value of the second DSV is smaller; and selecting one from the first and second candidate current output code words which corresponds to the smaller DSV absolute value as a final current output code word.

22. A method as recited in claim 18, further comprising the steps of:
predicting repetition of a minimum run length at least a predetermined number of times in the sequence of the generated output code words; and
when the repetition of the minimum run length is predicted, changing an output code word causing the repetition to prevent the repetition of the minimum run length from occurring in the sequence of the generated output code words.

23. An apparatus for recording auxiliary information, comprising:
means for generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;
means for sequentially connecting the generated output code words into a sequence which follows run length limiting rules; and
means for changing the run length limiting rules between RLL(1, 7) and RLL(1, 8) in response to auxiliary information to superimpose the auxiliary information on the sequence of the generated output code words;
wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

24. An apparatus as recited in claim 23, wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising means for generating a first candidate current output code word in response to a current input code word equal to one of the prescribed input code words by referring to the first specified one of the encoding tables, and means for generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the run length limiting rules.

25. An apparatus as recited in claim 24, further comprising means for selecting one from the first and second candidate current output code words as a final current output code word.

26. An apparatus as recited in claim 24, further comprising:
means for calculating a first CDS of the first candidate current output code word;
means for updating a first DSV of the first candidate current output code word and previous final output code words in response to the first CDS;
means for calculating a second CDS of the second candidate current output code word;
means for updating a second DSV of the second candidate current output code word and previous final output code words in response to the second CDS;
means for determining which of an absolute value of the first DSV and an absolute value of the second DSV is smaller; and
means for selecting one from the first and second candidate current output code words which corresponds to the smaller DSV absolute value as a final current output code word.

27. An apparatus as recited in claim 23, further comprising:
means for predicting repetition of a minimum run length at least a predetermined number of times in the sequence of the generated output code words; and
means for, when the repetition of the minimum run length is predicted, changing an output code word causing the repetition to prevent the repetition of the minimum run length from occurring in the sequence of the generated output code words.

28. A method of reproducing an auxiliary information from a sequence of 6-bit code words which is generated by the recording method in claim 18, the reproducing method comprising the steps of:
recovering encoding-table designation information from the code-word sequence, the encoding-table designation information representing which of encoding tables has been used in generating a code word immediately following a code word of interest; and
demodulating the code word of interest into an original code word by referring to a decoding table in response to the recovered encoding-table designation information.

29. A method as recited in claim 28, further comprising the steps of:
detecting whether the code-word sequence corresponds to (1, 7)RLL or (1, 8)RLL; and
reproducing auxiliary information in response to a result of detecting whether the code-word sequence corresponds to (1, 7)RLL or (1, 8)RLL.

30. An apparatus for reproducing an auxiliary information from a sequence of 6-bit code words which is generated by the recording apparatus in claim 23, the reproducing apparatus comprising:
means for recovering encoding-table designation information from the code-word sequence, the encoding-table designation information representing which of encoding tables has been used in generating a code word immediately following a code word of interest; and
means for demodulating the code word of interest into an original code word by referring to a decoding table in response to the recovered encoding-table designation information.

31. An apparatus as recited in claim 30, further comprising:
means for detecting whether the code-word sequence corresponds to (1, 7)RLL or (1, 8)RLL; and
means for reproducing auxiliary information in response to a result of detecting whether the code-word sequence corresponds to (1, 7)RLL or (1, 8)RLL.

32. A recording medium storing a sequence of code words which is generated by the recording apparatus in claim 23.

33. A transmission apparatus for transmitting a sequence of code words which is generated by the recording apparatus in claim 23.

34. A transmission method of transmitting a sequence of code words which is generated by the recording method in claim 18.

35. A method of reproducing data from a sequence of 6-bit code words which is generated by the recording method in claim 18, the reproducing method comprising the steps of:
recovering encoding-state information from the code-word sequence, the encoding-state information representing which of encoding tables has been used in generating a code word immediately following a code word of interest;
demodulating the code word of interest into an original code word by referring to a decoding table in response to the generated encoding-state information;
reproducing auxiliary information from the code-word sequence; and
executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to a URL address related to contents information, 10) playback of character information, 11) playback of an auxiliary-picture information, 12) playback of audio visual information, and 13) authentication as to whether or not a recording medium is legitimate.

36. A method as recited in claim 35, wherein the auxiliary-information reproducing step comprises the steps of:
  detecting whether the code-word sequence corresponds to (1, 7)RLL or (1, 8)RLL; and
  reproducing the auxiliary information in response to a result of detecting whether the code-word sequence corresponds to (1, 7)RLL or (1, 8)RLL.

37. An apparatus for reproducing data from a sequence of 6-bit code words which is generated by the recording apparatus in claim 23, the reproducing apparatus comprising:
  means for recovering encoding-state information from the code-word sequence, the encoding-state information representing which of encoding tables has been used in generating a code word immediately following a code word of interest;
  means for demodulating the code word of interest into an original code word by referring to a decoding table in response to the generated encoding-state information;
  means for reproducing auxiliary information from the code-word sequence; and
  means for executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to a URL address related to contents information, 10) playback of character information, 11) playback of an auxiliary-picture information, 12) playback of audio visual information, and 13) authentication as to whether or not a recording medium is legitimate.

38. An apparatus as recited in claim 37, wherein the auxiliary-information reproducing means comprises:
  means for detecting whether the code-word sequence corresponds to (1, 7)RLL or (1, 8)RLL; and
  means for reproducing the auxiliary information in response to a result of detecting whether the code-word sequence corresponds to (1, 7)RLL or (1, 8)RLL.

39. A modulation apparatus comprising:
  means for generating a final 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;
  means for generating a first candidate current output code word in response to a current input code word equal to one of prescribed input code words by referring to one of first and second specified encoding tables among the encoding tables which is designated by encoding-table designation information accompanying an immediately-preceding final output code word;
  means for generating a second candidate current output code word in response to the current input code word equal to said one of the prescribed input code words by referring to the other of the first and second specified encoding tables under conditions where a succession of the second candidate current output code word and the immediately-preceding final output code word follows a run length limiting rule;
  means for calculating a first DSV from the first candidate current output code word and previous final output code words;
  means for calculating a second DSV from the second candidate current output code word and previous final output code words;
  means for determining which of an absolute value of the first DSV and an absolute value of the second DSV is smaller;
  means for selecting one from the first and second candidate current output code words which corresponds to the smaller DSV absolute value as a final current output code word; and
  means for changing the run length limiting rule to change a maximum run length in a sequence of final output code words in response to auxiliary information to superimpose the auxiliary information on the sequence of the final output code words.

40. A modulation apparatus as recited in claim 39, wherein the sequence of the final output code words represents encryption-resultant main information, and the auxiliary information contains an information piece for decrypting the encryption-resultant main information.

41. A modulation apparatus as recited in claim 39, wherein the sequence of the final output code words represents scrambling-resultant main information, and the auxiliary information contains an information piece for descrambling the scrambling-resultant main information.

42. A demodulation apparatus comprising:
  means for recovering encoding-state information from a sequence of code words, the encoding-state information representing which of encoding tables has been used in generating a code word immediately following every code word of interest;
  means for demodulating the code word of interest into an original code word by referring to a decoding table in response to the generated encoding-state information;
  means for detecting a frequency of occurrence of a specified run length in the sequence of code words; and
  means for reproducing auxiliary information from the sequence of code words in response to the detected occurrence frequency.

43. A demodulation apparatus as recited in claim 42, further comprising means for decrypting encryption-resultant main information represented by a sequence of original code words in response to the reproduced auxiliary information.

44. A demodulation apparatus as recited in claim 42, further comprising means for descrambling scrambling-resultant main information represented by a sequence of original code words in response to the reproduced auxiliary information.

* * * * *